(12) United States Patent
Iwamuro

(10) Patent No.: US 7,713,794 B2
(45) Date of Patent: May 11, 2010

(54) MANUFACTURING METHOD OF A SEMICONDUCTOR DEVICE

(75) Inventor: Noriyuki Iwamuro, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 12/262,970

(22) Filed: Oct. 31, 2008

(65) Prior Publication Data

US 2009/0117724 A1 May 7, 2009

(30) Foreign Application Priority Data

Nov. 1, 2007 (JP) ............................. 2007-285021
Mar. 17, 2008 (JP) ............................. 2008-066985

(51) Int. Cl.
*H01L 21/332* (2006.01)

(52) U.S. Cl. .................. 438/140; 438/133; 438/172

(58) Field of Classification Search .................. 257/20, 257/288, 330, 347, 502, 532, 620, 622, 717; 438/140, 137, 172, 459, 542
See application file for complete search history.

(56) References Cited

U.S. PATENT DOCUMENTS 6,693,024 B2 * 2/2004 Lehmann et al. ............. 438/542
7,132,321 B2 * 11/2006 Kub et al. .................... 438/172
7,335,575 B2 * 2/2008 Hsu et al. .................... 438/459

FOREIGN PATENT DOCUMENTS

JP  2002-76326 A   3/2002
JP  2004-214542 A  7/2004

OTHER PUBLICATIONS

Tomoko Matsudai et al.,"Advanced 60um Thin 600V Punch-Through IGBT Concept for Extremely Low Forward Voltage and Low Turn-off Loss," IEEE ISPSD 2001, pp. 441-444.
T. Laska et al.,"The Field Stop IGBT (FS IGBT)—A New Power Device Concept with a Great Improvement Potential," IEEE ISPSD 2000, pp. 355-358.

* cited by examiner

*Primary Examiner*—Thanh V Pham
*Assistant Examiner*—Errol Fernandes
(74) *Attorney, Agent, or Firm*—Rossi, Kimms & McDowell LLP

(57) ABSTRACT

A manufacturing method of a semiconductor device includes the steps of forming an insulating film having a prescribed repetition pattern on one surface of a semiconductor substrate and then depositing semiconductor layers on the one surface of the semiconductor substrate; forming trenches from the other surface of the semiconductor substrate in such a manner that the trenches come into contact with the semiconductor layer, that plural trenches are formed for each semiconductor chip to be formed on the semiconductor substrate, and that at least one pattern of the insulating film is exposed through the bottom of each trench; and covering the inside surfaces of the trenches and the other surface of the semiconductor substrate with a metal electrode.

16 Claims, 21 Drawing Sheets

FIG. 14A
FIG. 14B
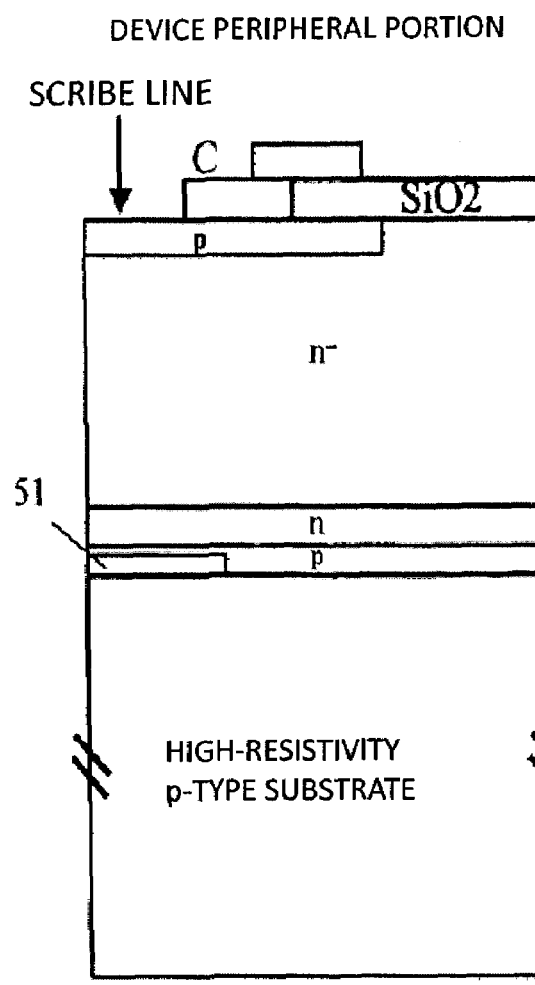
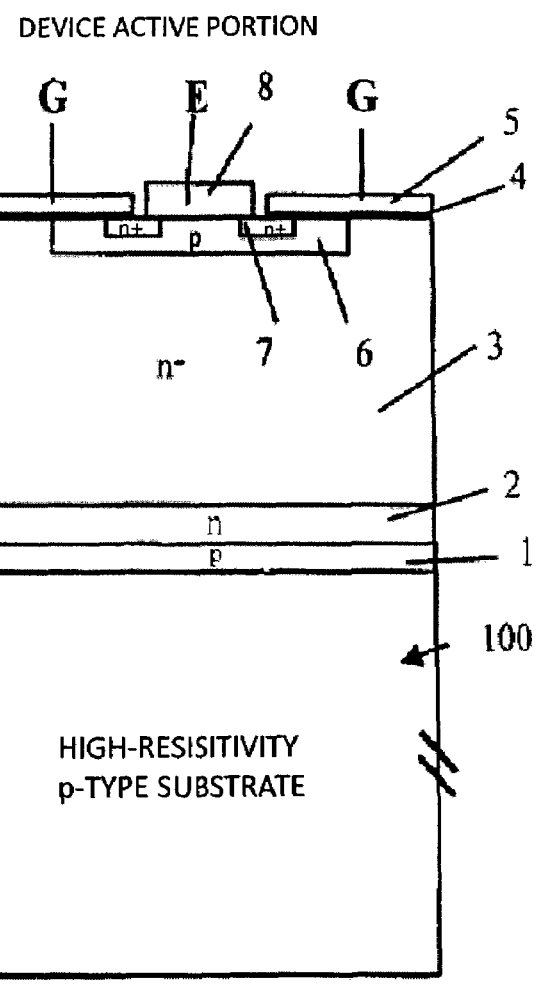

FIG. 15A
FIG. 15B
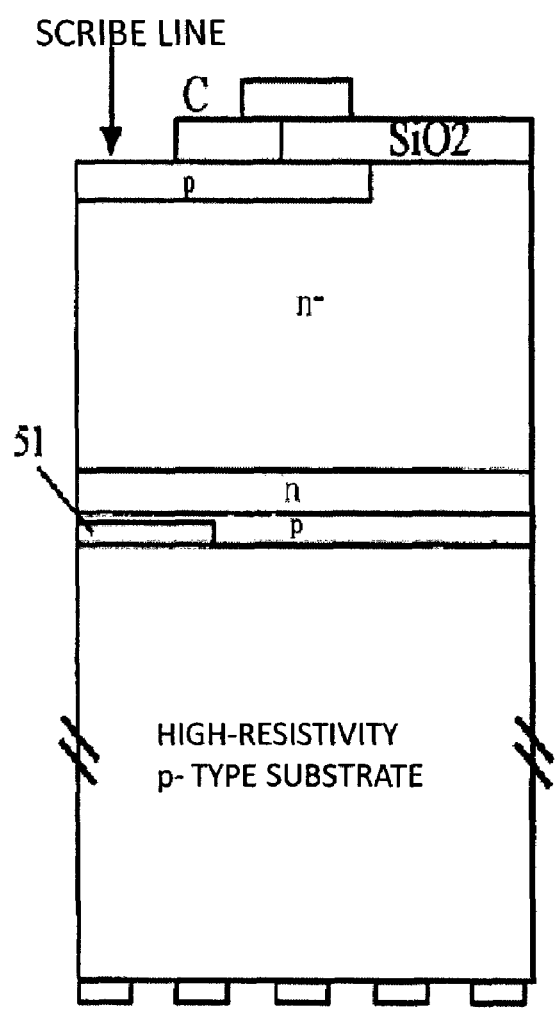
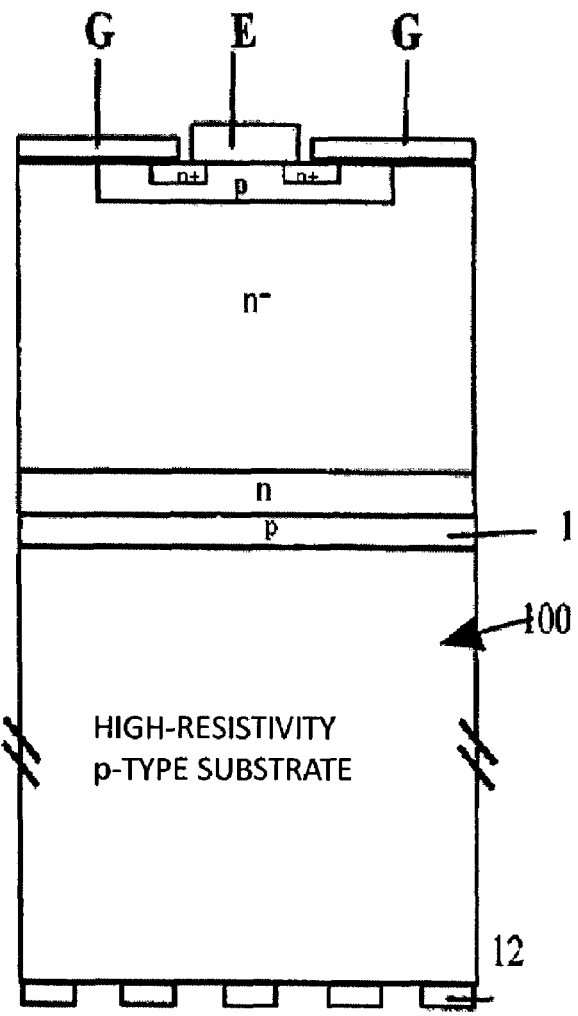

FIG. 18A
FIG. 18B
DEVICE PERIPHERAL PORTION
DEVICE ACTIVE PORTION
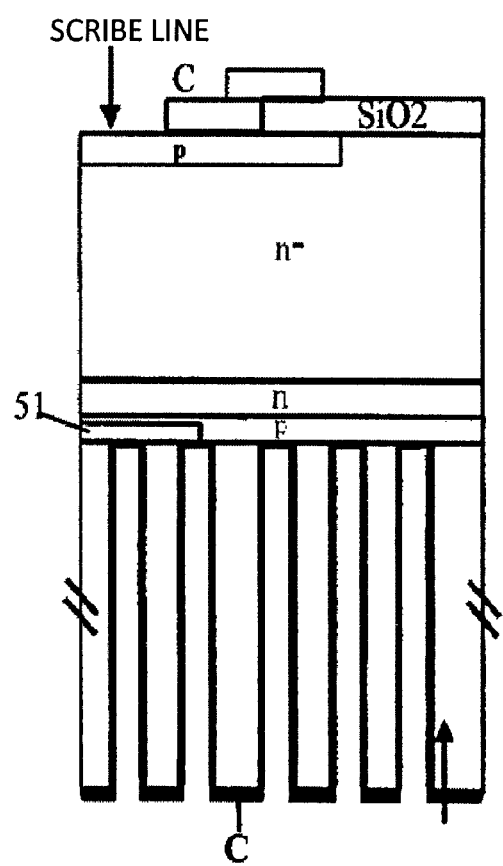
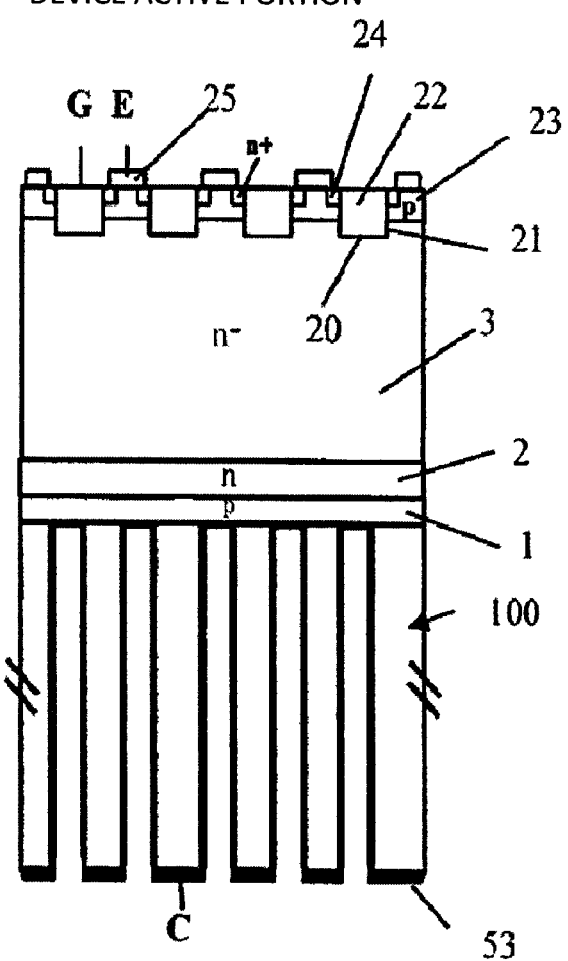

FIG. 20A
FIG. 20B
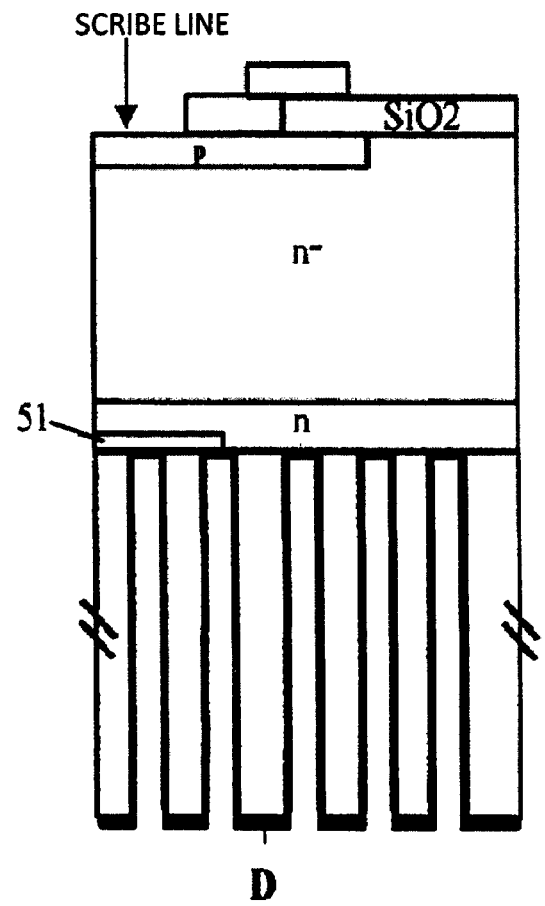
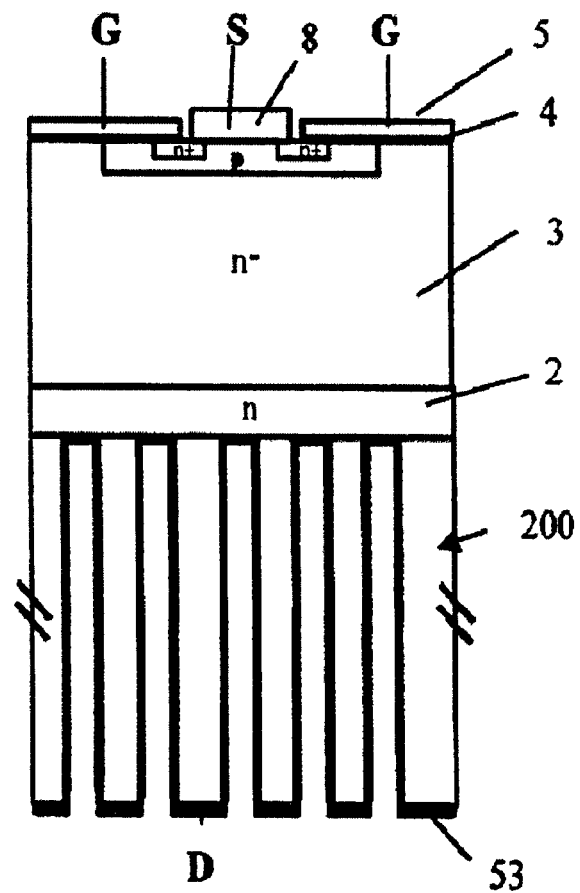

FIG. 21A
FIG. 21B
DEVICE PERIPHERAL PORTION
DEVICE ACTIVE PORTION
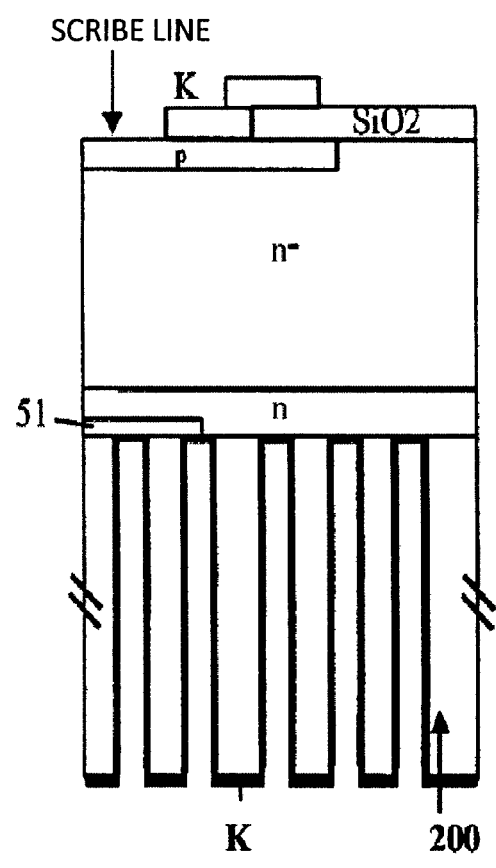
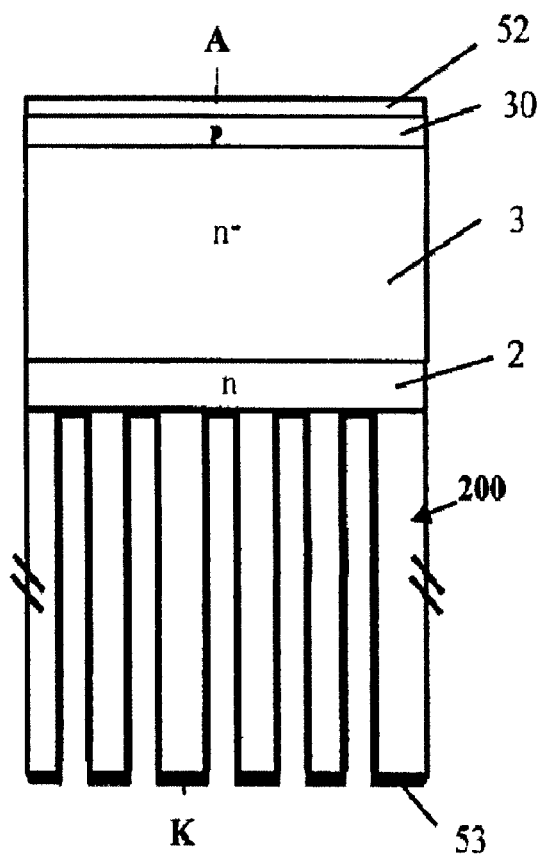

MANUFACTURING METHOD OF A SEMICONDUCTOR DEVICE

BACKGROUND OF THE INVENTION

The present invention relates to manufacturing methods for a high-breakdown-voltage, high-power vertical insulated-gate semiconductor device and rectification element (diode). More specifically, the invention relates to an IGBT and a MOSFET having an insulating film formed on the surface of a semiconductor layer or in trenches and a control electrode formed on the insulating film, a pn junction diode not having such a control electrode, and like devices.

To satisfy the recent requirements of miniaturization and enhanced performance of power source equipment in the power electronics field, efforts have been made in a concentrated manner to improve the performance, more specifically, to increase the breakdown voltage, increase the current, decrease the loss, increase the breakdown resistance, and increase the operation speed, in power semiconductor devices used in such power source equipment. In medium to high breakdown voltage range of 600 V to 6,500 V, insulated-gate bipolar transistors (hereinafter abbreviated as IGBTs) are the mainstream of power semiconductor devices. In IGBTs in the breakdown voltage range of 600 V to 1,700 V, remarkable improvements have been made in breakdown voltage among the above-mentioned various characteristics. The wafer thinning technique is a major technique that supports such improvements in the characteristics of IGBTs.

A device wafer process of the wafer thinning technique is as follows. First, a main device structure is formed on an FZ high-resistivity n⁻ silicon wafer. At a stage that is close to a final step of device formation, the wafer is ground from its back side to such a thickness that a necessary device breakdown voltage can be secured and a sufficiently low loss characteristic can be obtained. A shallow p-type collector layer and a deep n-type layer are formed by implanting impurity ions through the thus-ground wafer back surface and a metal electrode is contact-formed on the back surface. (T. Laska et al., "The Field Stop IGBT (FS IGBT)—A New Power Device Concept with a Great Improvement Potential," IEEE ISPSD 2000, pp. 355-358)

However, to secure a necessary device breakdown voltage and attain a low-loss characteristic, the wafer thickness after grinding is about 60 to 70 μm in devices having a breakdown voltage of 600 V and has a very small value of 100 μm+α in devices having a breakdown voltage of 1,200 V. If an 8-inch wafer, for example, having such a small thickness is handled and subjected to ion implantation and electrode formation from the back side, there is a very high probability that the wafer is broken during that course of processing. Accordingly, productivity cannot be increased easily. Furthermore, since ion implantation and activation are performed from the wafer front side at a stage that is after formation of a main device structure on the wafer front surface and close to a final step, the activation anneal temperature is restricted to 600° C. or less. This makes it difficult to control the impurity concentrations and the thicknesses of the p-type collector layer and the low-resistivity n-type layer.

On the other hand, the manufacturing process of what is commonly called a punchthrough IGBT using a thick wafer, which was employed before the invention of the wafer thinning technique, is as follows. An IGBT is formed by inputting, to a manufacturing process, a thick wafer in which an optimum-designed low-resistivity n-type layer and high-resistivity n⁻ drift layer are epitaxially grown in advance on a low-resistivity p⁺ silicon substrate of 300 to 500 μm in thickness. In this method, the impurity concentrations and the thicknesses of the low-resistivity n-type layer and the high-resistivity n⁻ drift layer are optimum-designed in advance and the thickness of the wafer (low-resistivity p⁺ silicon substrate) is as sufficiently large as 300 to 500 μm. Therefore, there is almost no probability that the wafer is broken during a device formation process and hence productivity using this process is high.

However, since the impurity concentration of the low-resistivity p⁺ silicon substrate is high and its thickness is too large, the minority carrier injection efficiency during an IGBT operation is very high. For example, it is known that an IGBT formed by this process is much worse in the on-voltage vs. turn-off loss characteristic etc. than an IGBT formed by the wafer thinning process even if such electrical characteristics as the turn-off characteristic are adjusted by a lifetime control process.

To solve this problem, in the above thick wafer process, a method has been proposed in which a low-resistivity p⁺ silicon substrate is ground from the back side at a final stage of the process to reduce its thickness to such an extent that it becomes a p-type collector layer of about 1 μm in thickness, and the minority carrier injection efficiency becomes low whereby the on-voltage vs. turn-off loss characteristic is improved (Tomoko Matsudai et al., "Advanced 60 μm Thin 600V Punch-through IGBT Concept for Extremely Low Forward Voltage and Low Turn-off Loss," IEEE ISPSD 2001, pp. 441-444).

Furthermore, the following technique is described in JP-A-2002-76326 (abstract and paragraph 0026), in which a semiconductor functional portion is formed on one surface of a bonded semiconductor substrate. As for the other surface, whereas an outermost peripheral portion of each semiconductor chip is left in a frame form, the central portion is etched away to form a recess in such a manner that the thickness of the bottom portion of the recess is reduced to a limit value that secures necessary semiconductor characteristics. The recess is filled with a metal. In this manner, a semiconductor device having a low switching loss is formed while a manufacturing process using a thick, large-diameter semiconductor substrate is executed. Also disclosed are methods for detecting an etching end point in etching the back side of the semiconductor substrate in a frame form. In one method, an etching method is employed in which a substrate obtained by bonding semiconductor substrates having different crystal face orientations is used and etching anisotropy is provided because of the different crystal face orientations. Etching is performed at a correct depth from the back surface to the bonding boundary. In another method, an etching method is employed in which an insulating film is formed at the bonding boundary and used as an etching end point sensor.

Still further, a vertical MOSFET is known which has a trench gate structure and a trench drain opposed to it (See Japanese Patent No. 3,957,638). Trench gate bottoms and a semiconductor substrate that faces the trench gate bottoms are insulated from each other by an oxide film and trench drains penetrate through the oxide film and are in contact with the semiconductor substrate.

However, in the thick wafer grinding method of Matsudai et al., since the wafer grinding accuracy is usually about ±5 μm, the p-type collector layer may be lost entirely by excessive grinding when it is formed by grinding the thick, low-resistivity p⁺ silicon substrate in a final step so as to leave a 1-μm-thick layer. In this case, the on-voltage becomes very high. Conversely, if a p-type collector layer that is thicker than the design value 1 μm is left, a drawback arises that the loss characteristics vary to a very large extent as exemplified by a large turn-off loss. Furthermore, in the thick wafer grinding method of Matsudai et al., the thickness of a ground wafer is 60 to 70 µm. Therefore, as in the wafer thinning technique of Laska et al., there is a drawback that a wafer may be broken in steps that follow the step of thinning the wafer, such as a back surface electrodes forming step. As such, the thick wafer grinding method of Matsudai et al. has not been put into practical use yet.

That is, in the wafer thinning technique of Laska et al., an optimum design value of the thickness of the p-type collector layer can be attained more reliably than in the thick wafer grinding method of Matsudai et al. but a wafer is prone to be broken during a process (i.e., the productivity is low). In the thick wafer grinding method of Matsudai et al., optimum design values of the impurity concentration of the p-type collector layer and the impurity concentration and the thickness of the low-resistivity n-type layer can be realized and the productivity in terms of a low likelihood of wafer breakage during a process is high. However, it has a problem that device characteristics are made very bad due to thickness variation of the p-type collector layer.

SUMMARY OF THE INVENTION

The present invention has been made in view the above circumstances, and provides a high-productivity manufacturing method of a semiconductor device which enables optimum designing of the impurity concentrations and the thicknesses of a low-resistivity epitaxial p-type layer, an epitaxial n-type layer, a high-resistivity epitaxial n⁻ drift layer, etc. that influence the device characteristics without any restrictions on a device forming process, and which provides as good device characteristics even with use of a thick wafer as in the case of using a wafer formed by the wafer thinning technique.

In one embodiment, a manufacturing method of a semiconductor device is provided that includes the steps of forming an insulating film having a prescribed repetition pattern on one surface of a semiconductor substrate and then depositing a semiconductor layer on the one surface of the semiconductor substrate; forming semiconductor device portions in the semiconductor layer in a prescribed repetition pattern; forming trenches from the other surface of the semiconductor substrate at such a depth that the trenches come into contact with the semiconductor layer in such a manner that plural trenches are formed for each semiconductor device portion and that at least parts of the insulating film are exposed through bottoms of the trenches; and covering inside surfaces of the trenches and the other surface of the semiconductor substrate with a metal electrode.

The parts of the insulating film exposed through the bottoms of the trenches may have such a pattern as to be exposed through the bottoms of all the trenches.

The insulating film may have a lattice-shaped, stripe-shaped, or dot-shaped repetition pattern.

The insulating film may have a lattice-shaped repetition pattern whose narrow stretches extend along scribe lines, the semiconductor device portions forming step may be a step of forming a semiconductor device portion in each part of the semiconductor layer that is surrounded by the lattice-shaped insulating film, and in the trenches forming step at least parts of the lattice-shaped repetition pattern may be exposed through the bottoms of the trenches.

Further, the trenches forming step may use the insulating film as an end point detection film for etching for forming trenches from the other surface of the semiconductor substrate at such a depth that the trenches come into contact with the semiconductor layer.

The semiconductor layer may be such that a first semiconductor layer of a first conductivity type that is lower in resistivity than the semiconductor substrate, a second semiconductor layer of a second conductivity type, and a third semiconductor layer of the second conductivity type that is higher in resistivity than the second semiconductor layer that are epitaxially grown and are arranged in this order from the side of the semiconductor substrate; and each of the semiconductor device portions may have, as main components, a channel region of the first conductivity type that is formed selectively in the third semiconductor layer adjacent to its surface and an emitter region of the second conductivity type that is formed selectively in the channel region adjacent to its surface, and also have a gate electrode formed on a surface portion of the channel region that is located between a surface portion of the emitter region and a surface portion of the third semiconductor layer with a gate insulating film interposed in between and an emitter electrode that is in contact with both of a surface portion of the channel region and a surface portion of the emitter region.

The gate electrode may be formed, with the gate insulating film interposed in between, on inside surfaces of trenches that penetrate through the channel region from surfaces of emitter regions and reach the third semiconductor layer.

The semiconductor substrate may be a high-resistivity substrate of a second conductivity type; the semiconductor layer may be such that a fourth semiconductor layer of the second conductivity type that is lower in resistivity than the semiconductor substrate and a fifth semiconductor layer of the second conductivity type that is higher in resistivity than the fourth semiconductor layer are epitaxially grown and are arranged in this order from the side of the semiconductor substrate; and each of the semiconductor device portions may have, as main components, a channel region of a first conductivity type that is formed selectively in the fifth semiconductor layer adjacent to its surface and a source region of the second conductivity type that is formed selectively in the channel region adjacent to its surface, and also have a gate electrode formed on a surface portion of the channel region that is located between a surface portion of the source region and a surface portion of the fifth semiconductor layer with a gate insulating film interposed in between and a source electrode that is in contact with both of a surface portion of the channel region and a surface portion of the source region.

The gate electrode may be formed, with the gate insulating film interposed in between, on inside surfaces of trenches that penetrate through the channel region from surfaces of source regions and reach the fifth semiconductor layer.

The semiconductor substrate may be a high-resistivity substrate of a second conductivity type; and the semiconductor layer may be such that a sixth semiconductor cathode layer of the second conductivity type that is lower in resistivity than the semiconductor substrate and a seventh semiconductor layer of the second conductivity type that is higher in resistivity than the sixth semiconductor layer are epitaxially grown and are arranged in this order from the side of the semiconductor substrate, and that a low-resistivity eighth semiconductor anode layer of a first conductivity type is formed as a surface layer of the seventh semiconductor layer.

The invention can provide a high-productivity manufacturing method of a semiconductor device which enables optimum designing of the impurity concentrations and the thicknesses of a low-resistivity epitaxial p-type layer, an epitaxial n-type layer, a high-resistivity epitaxial n⁻ drift layer, etc. that influence the device characteristics without any restrictions on a device forming process, and which provides as good device characteristics even with use of a thick wafer as in the case of using a wafer formed by the wafer thinning technique.

BRIEF DESCRIPTION OF THE DRAWINGS

The invention will now be described with reference to certain preferred embodiments thereof and the accompanying drawings, wherein:

FIG. 13 to FIGS. 16A and 16B are sectional views of important parts of a wafer and show an IGBT manufacturing process according to the fifth embodiment of the invention;

FIGS. 18A and 18B are sectional view of important parts of an IGBT according to a sixth embodiment of the invention;

FIGS. 20A and 20B are sectional view of important parts of a MOSFET according to a seventh embodiment of the invention; and FIGS. 21A and 21B are sectional view of important parts of a pn junction diode according to an eighth embodiment of the invention.

DETAILED DESCRIPTION OF THE INVENTION

Manufacturing methods of a semiconductor device according to embodiments of the present invention will be hereinafter described in detail with reference to the drawings. The invention is not limited to the following embodiments, that is, various modifications are possible without departing from the spirit and scope of the invention.

Embodiment 1

Figure 1:
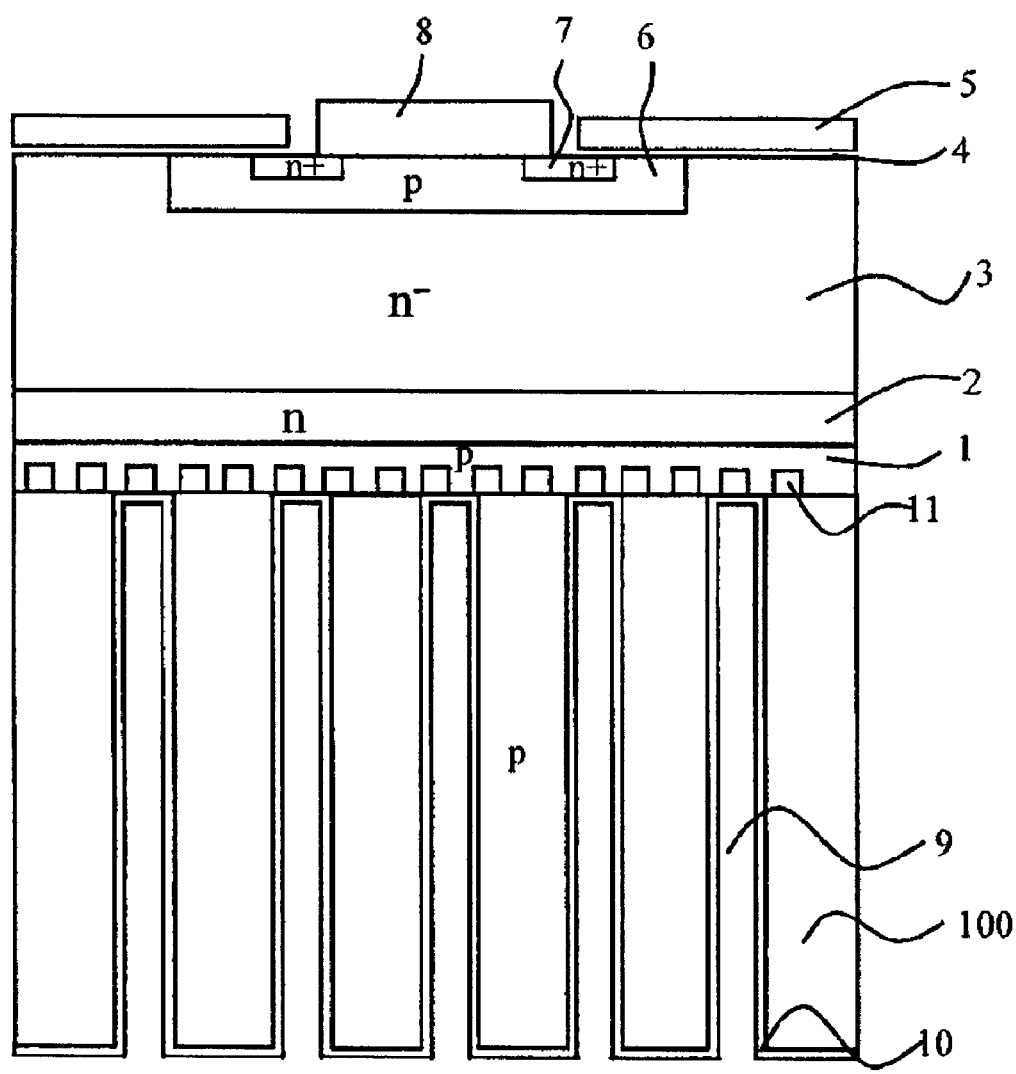
FIG. 1 is a sectional view of an important part of an IGBT according to a first embodiment of the present invention.

A first embodiment of the invention will be described below in detail with reference to FIGS. 1-6. The first embodiment is directed to an IGBT having a breakdown voltage of 600V. FIG. 1 is a sectional view of an important part of an IGBT according to the first embodiment. As shown in FIG. 1, in the IGBT according to the first embodiment, a silicon oxide film 11 is formed on a 500-μm-thick high-resistivity p-type silicon substrate 100 so as to have a selectively formed pattern. A 0.6-μm-thick epitaxial p-type layer (first semiconductor layer; may be hereinafter abbreviated as "p-type collector layer") 1 having an impurity concentration of $3.0 \times 10^{17}$ cm$^{-3}$ and a 2.0-μm-thick epitaxial n-type layer (second semiconductor layer) 2 having an impurity concentration of $2.0 \times 10^{16}$ cm$^{-3}$ are formed on the silicon oxide film 11 by epitaxial silicon growth. An epitaxial high-resistivity n⁻ drift layer (third semiconductor layer) 3 is laid on the epitaxial n-type layer 2. To attain a breakdown voltage of 600 V with a sufficient margin, the impurity concentration and the thickness of the epitaxial high-resistivity n⁻ drift layer 3 are set at $2.0 \times 10^{14}$ cm$^{-3}$ and 60 μm, respectively. Then, a 100-nm-thick gate oxide film 4 is formed and a gate electrode 5 is formed by forming and patterning a polysilicon layer. A p-type channel region 6 and n⁺ emitter regions 7 are formed by ion implantation and thermal diffusion by a self-align method using the polysilicon gate electrode 5. After a BPSG (borophosphosilicate glass) interlayer insulating film (not shown) is formed, patterned, and subjected to heat treatment, an emitter electrode 8 is formed by sputtering a 5-μm-thick Al—Si (1%) film and patterning and heat-treating it. A 10-μm-thick polyimide layer (not shown) is formed on the interlayer insulating film, patterned so that electrode pads are exposed, and subjected to heat treatment. Then, trench etching is performed by reactive ion etching (RIE) from the back side of the high-resistivity p-type silicon substrate 100 until the epitaxial p-type collector layer 1 is exposed. An IGBT wafer is completed by forming a back-side metal electrode 10. Although in the first embodiment the high-resistivity p-type silicon substrate 100 is used, a high-resistivity n-type silicon substrate may be used instead.

The method of forming a vertical device by forming a device on the front surface of a semiconductor substrate, forming trenches from the back side of the substrate, and forming an electrode in the trenches is disclosed in the above-mentioned publication JP-A-2002-76326 and Japanese Patent No. 3,957,638, for example. However, no method for forming, from the back side, trenches having such an accurate depth that the trenches reach the position of a target impurity layer has been proposed yet. In particular, in the IGBT of the first embodiment, trouble such as the on-voltage characteristic deteriorates to a large extent unless the trench etching is finished when it just reaches the p-type collector layer 1.

Figure 2:
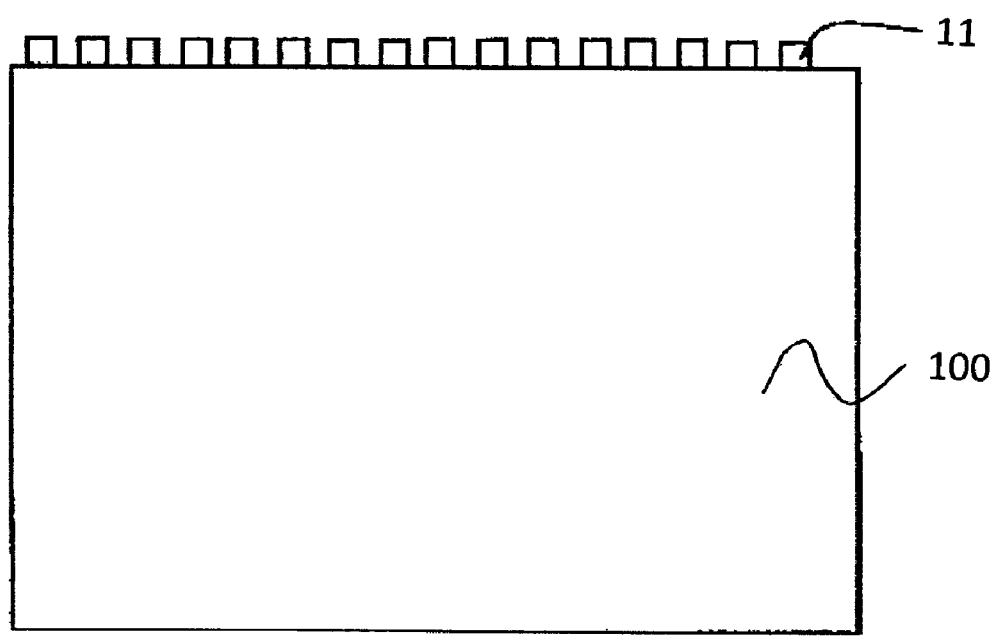
FIGS. 2-5 are sectional views of important parts of a wafer and show respective manufacturing steps of an IGBT manufacturing process according to the first embodiment of the invention.
Figure 3:
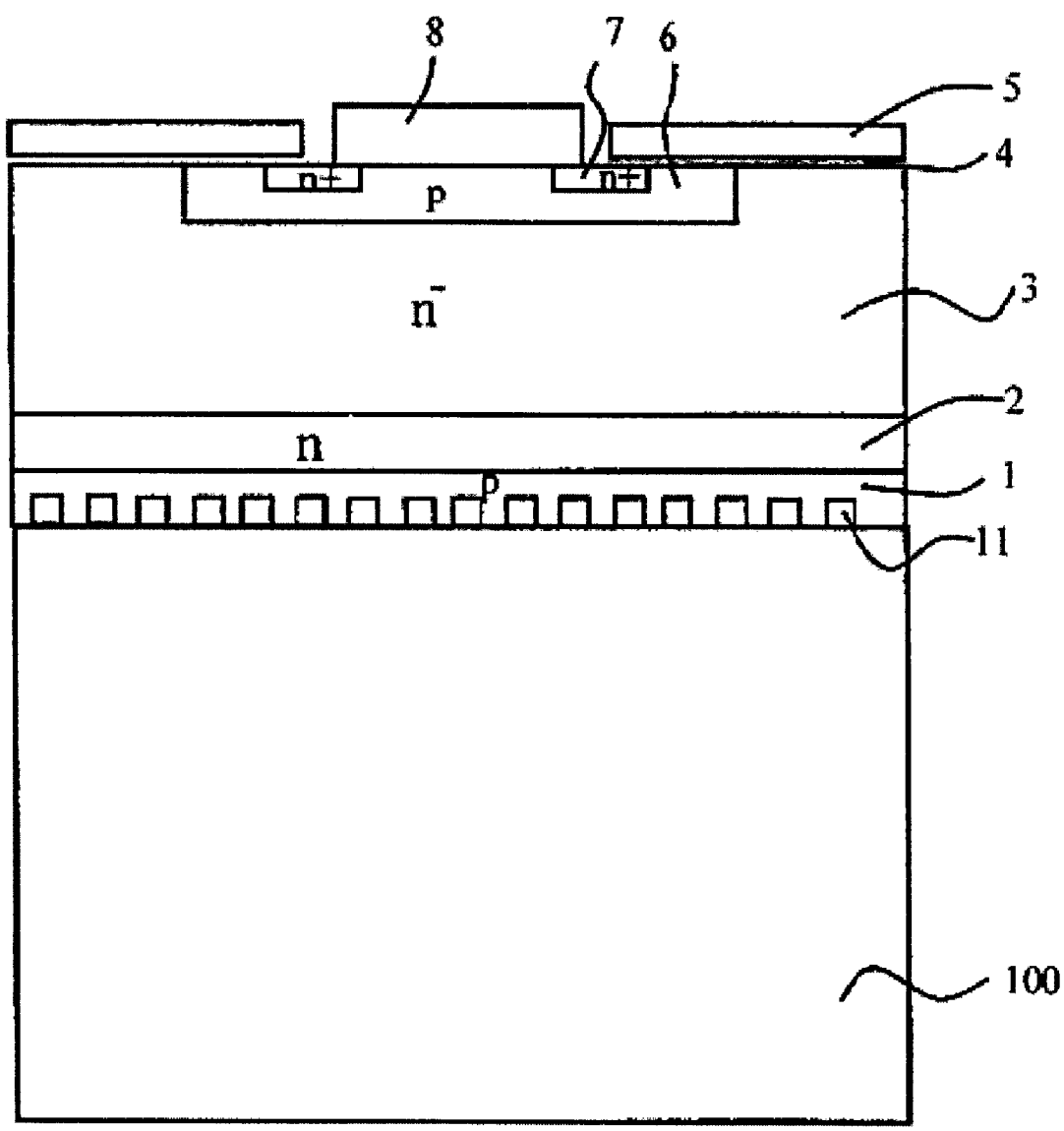

The manufacturing method of an IGBT according to the first embodiment includes a solution to the above problem, and will be described below in detail with reference to FIGS. 2-5. An 8-inch-diameter high-resistivity p-type silicon substrate 100 is prepared. As shown in FIG. 2, a 0.2-μm-thick silicon oxide film is formed on the p-type silicon substrate 100 and is patterned so that 1-μm-wide, dot-shaped silicon oxide film patterns 11 are formed at intervals of 1 μm by partially removing the oxide film in a lattice of 1 μm in width and 2 μm in pitch. Alternatively, a lattice-shaped or stripe-shaped silicon oxide film 11 may be formed.

A 0.6-μm-thick p-type collector layer 1 having an impurity concentration of $3.0\times10^{17}$ cm$^{-3}$ is formed on the silicon oxide film patterns 11 by epitaxial silicon growth which is a known technique. Boron is used as the impurity. Then, a 3.0-μm-thick epitaxial n-type layer 2 having an impurity concentration of $2.0\times10^{16}$ cm$^{-3}$ and a 60-μm-thick high-resistivity n$^-$ drift layer 3 having an impurity concentration of $2.0\times10^{14}$ cm$^{-3}$ are formed on the p-type collector layer 1. Phosphorus is used as the n-type impurity. Then, a 100-nm-thick silicon oxide film is formed as a gate oxide film 4 and a polysilicon gate electrode 5 is formed by forming and patterning a 0.5-μm-thick conductive polysilicon layer. Then, a p-type channel region 6 of about 2.5 μm in depth is formed selectively by ion implantation and thermal diffusion using the polysilicon gate electrode 5 as a mask. The dose of the impurity which is boron is $8.0\times10^{13}$ cm$^{-2}$ and the thermal diffusion temperature and time are 1,150° C. and 2 hours. Then, 0.4-μm-thick n$^+$ emitter regions 7 are formed by implanting arsenic ions at a dose of $5.0\times10^{15}$ cm$^{-2}$. Then, a 1.0-μm-thick BPSG interlayer insulating film (not shown) is deposited, patterned, and subjected to heat treatment of 1,000° C., and an emitter electrode 8 is formed by sputtering a 5-μm-thick Al—Si (1%) film and patterning and performing heat treatment of 400° C. on it. Then, after a 10-μm-thick polyimide surface protective film (not shown) is formed on the emitter electrode 8, it is patterned so as to form windows for exposing the emitter electrode 8 and a gate electrode pad (not shown) and then subjected to heat treatment of 300° C. (see FIG. 3). The interlayer insulating film and the surface protective film are omitted in FIG. 3.

Figure 4:
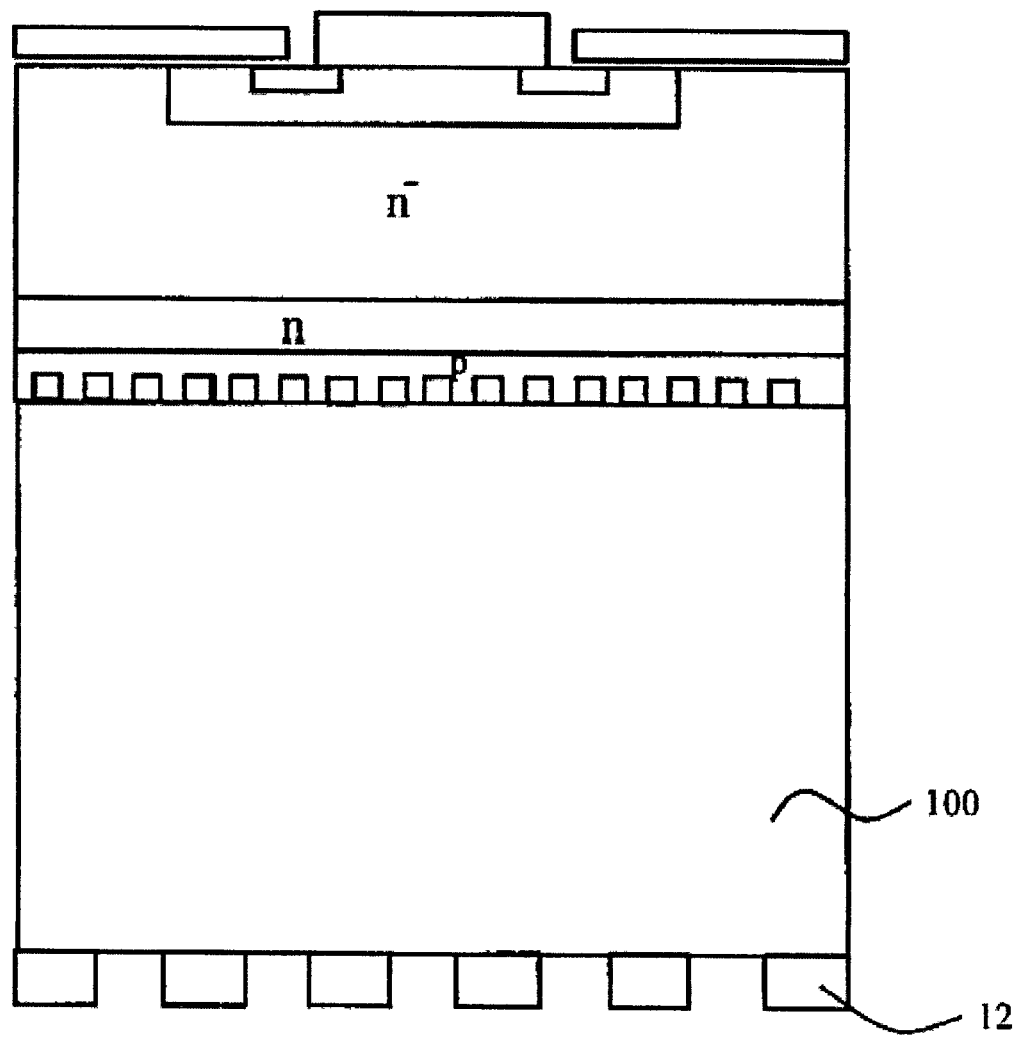
Figure 5:
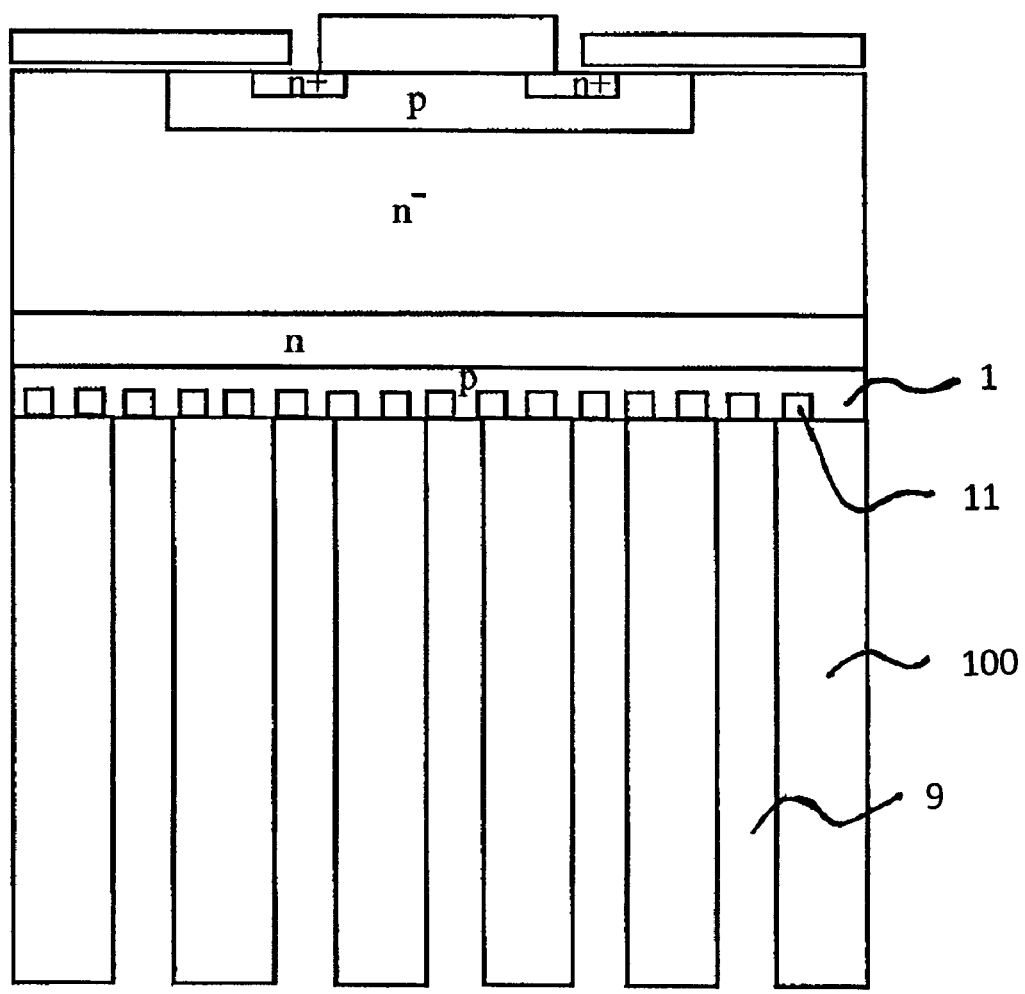

Subsequently, as shown in FIG. 4, a 1.6-μm-thick oxide film 12 is grown on the back surface of the wafer, that is, the exposed surface of the high-resistivity p-type substrate 100, and an oxide film mask 12 having stripe patterns that are 5 μm in width and are spaced from each other by 5 μm are formed by photolithography and etching. Then, trenches 9 are formed by etching the p-type substrate 100 from the wafer back side by RIE using the oxide film 12 as a mask. In the first embodiment, to shorten the trench etching time, an oxide film 12 is grown and trench etching is performed after the entire back surface of the wafer is ground to reduce the thickness from the original value of 500 μm to 250 μm, that is, in such a range that the wafer will not be broken in a later wafer process. It is important to stop the trench etching when it just reaches the p-type collector layer 1. Since as mentioned above the thickness of the p-type collector layer 1 is set at the relatively small value of 0.6 μm to improve the electrical characteristics, it is usually difficult to stop the etching when it just reaches the surface of the p-type collector layer 1. In contrast, in the embodiment, since the silicon oxide film patterns 11 of 0.2 μm in thickness and 1 μm in width are disposed between the high-resistivity p-type substrate 100 and the p-type collector layer 1 so as to be arranged at regular intervals of 1 μm in both of the horizontal and vertical directions, the silicon oxide film 11 starts to be etched as soon as the tips of the striped trenches 9 reach the p-type collector layer 1 in forming them in stripe form by etching. When the silicon oxide film 11 starts to be etched, the oxygen emission amount increases rapidly. Therefore, as shown in FIG. 5, the etching can be stopped when the tips of the trenches 9 just reach the surface of the p-type collector layer 1 by stopping the etching upon detection of rapid increase of oxygen during the etching. If the oxide film 11, which serves for etching end point detection, were formed also at the periphery of the wafer, the oxide film 11 would be exposed and might not serve properly for etching end point detection. In view of this, it is necessary that the oxide film 11 be formed inside a circle that is spaced inward from the wafer periphery by at least about 20 μm.

Subsequently, as shown in FIG. 1, Al, Ti, Ni, and Au metal films (collector electrode) 10 are formed in this order on the bottom surfaces and the side surfaces of the trenches 9 and the entire back surface of the wafer by vacuum evaporation. The wafer process for forming an IGBT according to the first embodiment is thus generally completed.

Since the width and the interval of the dot-shaped oxide film patterns 11 are both set at 1 μm and the width and the interval of the back-side striped trenches 9 are both set at 5 μm, 4-μm-wide portions of the p-type collector layer 1 are necessarily exposed at the tips of the trenches 9 however the trenches 9 are formed. Therefore, when the collector electrode 10 is formed later, the p-type collector layer 1 can reliably be brought into contact with the metal film (collector electrode) 10.

It has been confirmed that the IGBT formed in the above-described manner exhibits a good switching characteristic without the need for executing a lifetime control process which is usually employed to increase the switching speed. One hundred 8-inch-diameter, 600-V IGBT wafers were produced by the manufacturing method according to the first embodiment and no wafer was broken during a wafer process to completion of an IGBT wafer. It has thus been found that the manufacturing method according to the first embodiment is very high in productivity.

For comparison, 100 8-inch-diameter IGBT wafers were produced by using the above-described conventional wafer thinning technique (FZ wafers were used). About 35 of the 100 wafers (wafer thickness: 65 μm) were broken. Many of the about 35 wafers were broken while wafer handing, formation of an impurity layer through the back surface, or formation of a metal electrode was done after grinding for thickness reduction. Whereas in the first embodiment the collector electrode 10 is formed by vacuum evaporation, none of 100 8-inch-diameter wafers were broken even in the case where the collector electrode 10 was formed by another method such as sputtering or plating.

Figure 6:
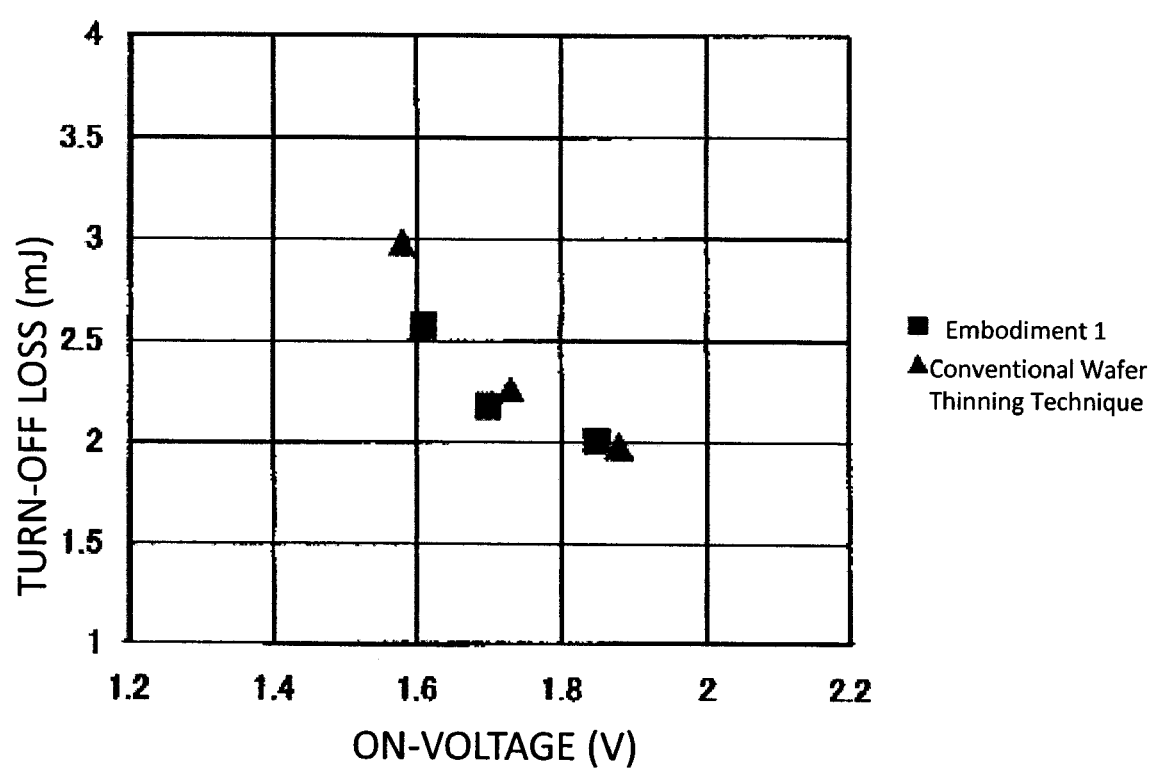
FIG. 6 shows a result of comparison between on-voltage/turn-off loss tradeoff characteristics of an IGBT formed according to the first embodiment of the invention and an IGBT formed by using a conventional wafer thinning technique.

FIG. 6 shows a result of comparison between electrical characteristics (on-voltage/turn-off loss tradeoff characteristics) of a planar-gate IGBT formed according to the first embodiment and that formed by the above-described conventional wafer thinning process. The chip size was 6.8 mm square, the device rating was 600 V/100 A, and the current density rating was 300 A/cm$^2$. The IGBT formed according to the first embodiment exhibited a breakdown voltage of 730 V which was sufficiently high for a 600-V device like the IGBT formed by the conventional wafer thinning process which had a breakdown voltage of 726 V. For reference, the above-described conventional punchthrough IGBT had a breakdown voltage of 702 V. It is seen from FIG. 6 that the tradeoff characteristic of the IGBT formed according to the first embodiment is approximately the same as that of the IGBT formed by the conventional wafer thinning process and hence is very good. Although not shown in FIG. 6, it was also found that the conventional punchthrough IGBT had an on-voltage of 2.2 V and a turn-off loss of 6.2 mJ, which are out of the range of the FIG. 6 graph and hence mean that the loss is large. The three points (see FIG. 6) of the tradeoff characteristic of the IGBT formed according to the first embodiment are evaluation results corresponding to the above-mentioned impurity concentration $3.0\times10^{17}$ cm$^{-3}$ of the p-type collector layer 1 plus two additional impurity concentrations $2.0\times10^{17}$ cm$^{-3}$ and $4.0\times10^{17}$ cm$^{-3}$. The measurement temperature was 125° C. It is seen from the above discussion that the IGBT manufacturing method according to the first embodiment has high productivity and an IGBT manufactured by that method exhibits very good electrical characteristics.

Embodiment 2

Figure 7:
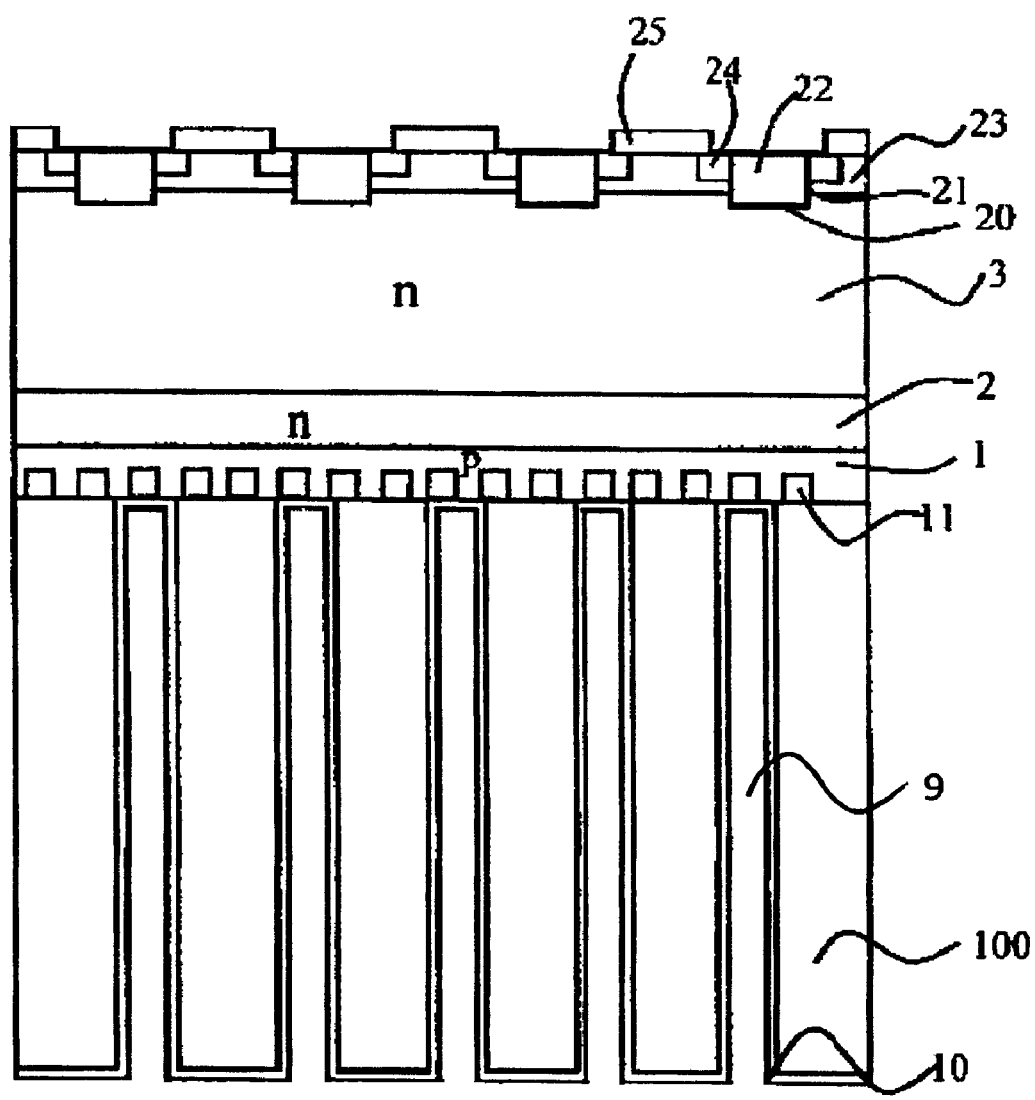
FIG. 7 is a sectional view of an important part of an IGBT according to a second embodiment of the invention.

FIG. 7 is a sectional view of an important part of an IGBT having a breakdown voltage of 600 V according to a second embodiment. As shown in FIG. 7, in the IGBT according to the second embodiment, as in the IGBT according to the first embodiment, a silicon oxide film 11 is formed on an 8-inch-diameter high-resistivity p-type silicon substrate 100 so as to have a selectively formed pattern. A 0.6-μm-thick epitaxial p-type collector layer 1 having an impurity concentration of $3.0 \times 10^{17}$ cm$^{-3}$ and a 3.0-μm-thick epitaxial n-type layer 2 having an impurity concentration of $2.0 \times 10^{16}$ cm$^{-3}$ are formed on the silicon oxide film 11. An epitaxial high-resistivity n$^-$ drift layer 3 is laid on the epitaxial n-type layer 2. Although in the second embodiment the high-resistivity p-type silicon substrate 100 is used as a thick silicon substrate (support substrate), a high-resistivity n-type silicon substrate may be used instead. To attain a breakdown voltage of 600 V with a sufficient margin, as in the first embodiment, the impurity concentration and the thickness of the epitaxial high-resistivity n$^-$ drift layer 3 are set at $2.0 \times 10^{14}$ cm$^{-3}$ and 60 μm, respectively. Then, to form a trench gate structure, 1.2-μm-wide trenches 20 are formed at regular intervals (pitch: 5 μm) at a depth of 4.5 μm. Forming the trenches 20 with sufficient care allows them to be formed so that their bottoms have a radius of curvature of 0.6 μm. After a 100-nm-thick gate oxide film 21 is grown, polysilicon gate electrodes 22 are buried and a p-type channel region 23 and n$^+$ emitter regions 24 are formed. And an interlayer insulating film (not shown), an emitter electrode 25, and a passivation film (not shown) are formed in the same manner as in the first embodiment. The thickness of the emitter electrode 25, the composition of the metal lamination film as the emitter electrode 25, and the heat treatment temperature for its formation are set the same as in the first embodiment. Al, Ti, Ni, and Au metal films (collector electrode) 10 are formed in this order on the bottom surfaces and the side surfaces of the trenches 9 and the entire back surface of the wafer by vacuum evaporation (the wafer back side forming process is the same as in the first embodiment). A trench-gate IGBT is thus completed.

One hundred 8-inch-diameter, 600-V IGBT wafers were produced by the above manufacturing method. Although a lifetime control process for increasing the switching speed was not employed, no wafer was broken during a wafer process to completion of an IGBT wafer. It has thus been found that the manufacturing method according to the second embodiment is very high in productivity like that according to the first embodiment.

Figure 8:
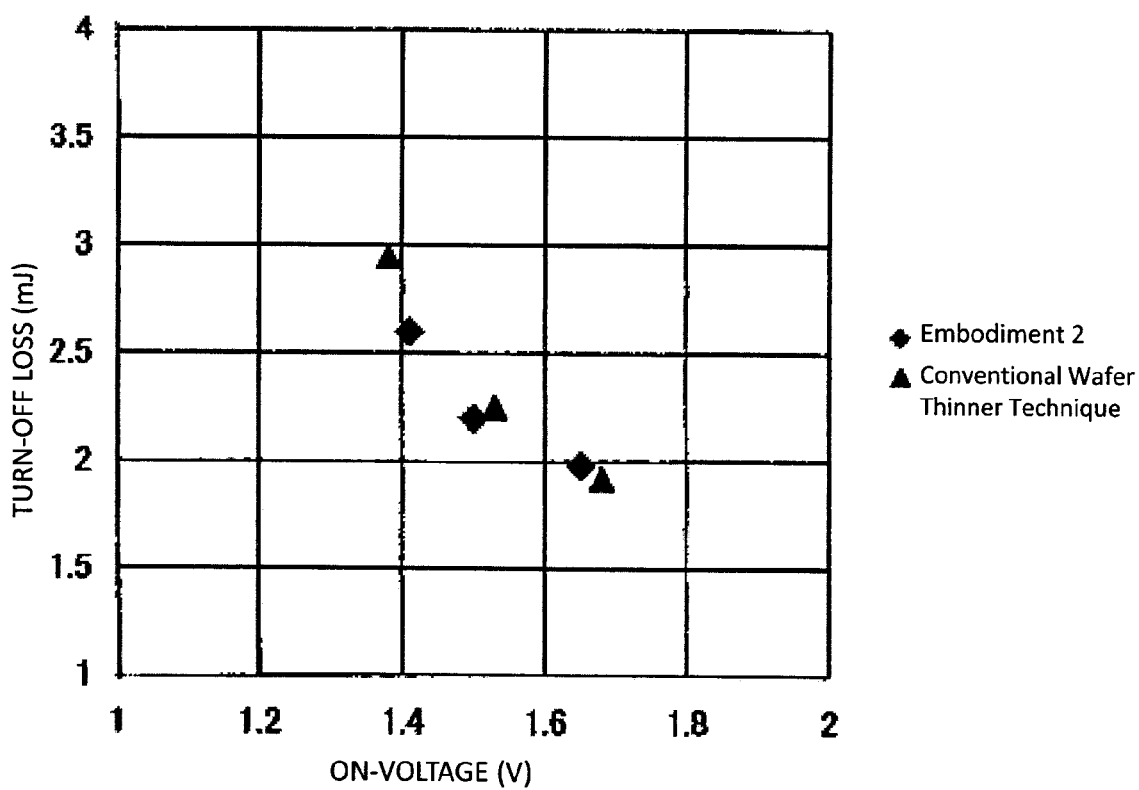
FIG. 8 shows a result of comparison between on-voltage/turn-off loss tradeoff characteristics of an IGBT formed according to the second embodiment of the invention and an IGBT formed by using the conventional wafer thinning technique.

FIG. 8 shows a result of comparison between electrical characteristics (on-voltage/turn-off loss tradeoff characteristics) of a trench-gate IGBT formed according to the second embodiment and that formed by the above-described conventional wafer thinning process. The chip size was 6.8 mm square, the device rating was 600 V/100 A, and the current density rating was 300 A/cm$^2$. The IGBT formed according to the second embodiment exhibited a breakdown voltage of 723 V which was sufficiently high for a 600-V device like the IGBT formed by the conventional wafer thinning process which had a breakdown voltage of 722 V. It is seen from FIG. 8 that the tradeoff characteristic of the IGBT formed according to the second embodiment is approximately the same as that of the IGBT formed by the conventional wafer thinning process and hence is very good. The conventional punch-through trench-gate IGBT had an on-voltage of 2.0 V and a turn-off loss of 6.1 mJ, which are out of the range of the FIG. 8 graph and hence mean that the loss is large. The three points (see FIG. 8) of the tradeoff characteristic of the IGBT formed according to the second embodiment are evaluation results corresponding to the above-mentioned impurity concentration $3.0 \times 10^{17}$ cm$^{-3}$ of the p-type collector layer 1 plus two additional impurity concentrations $2.0 \times 10^{17}$ cm$^{-3}$ and $4.0 \times 10^{17}$ cm$^{-3}$. The measurement temperature was 125° C. It is seen from the above discussion that the IGBT manufacturing method according to the second embodiment has high productivity and an IGBT manufactured by that method exhibits very good electrical characteristics.

Embodiment 3

Figure 9:
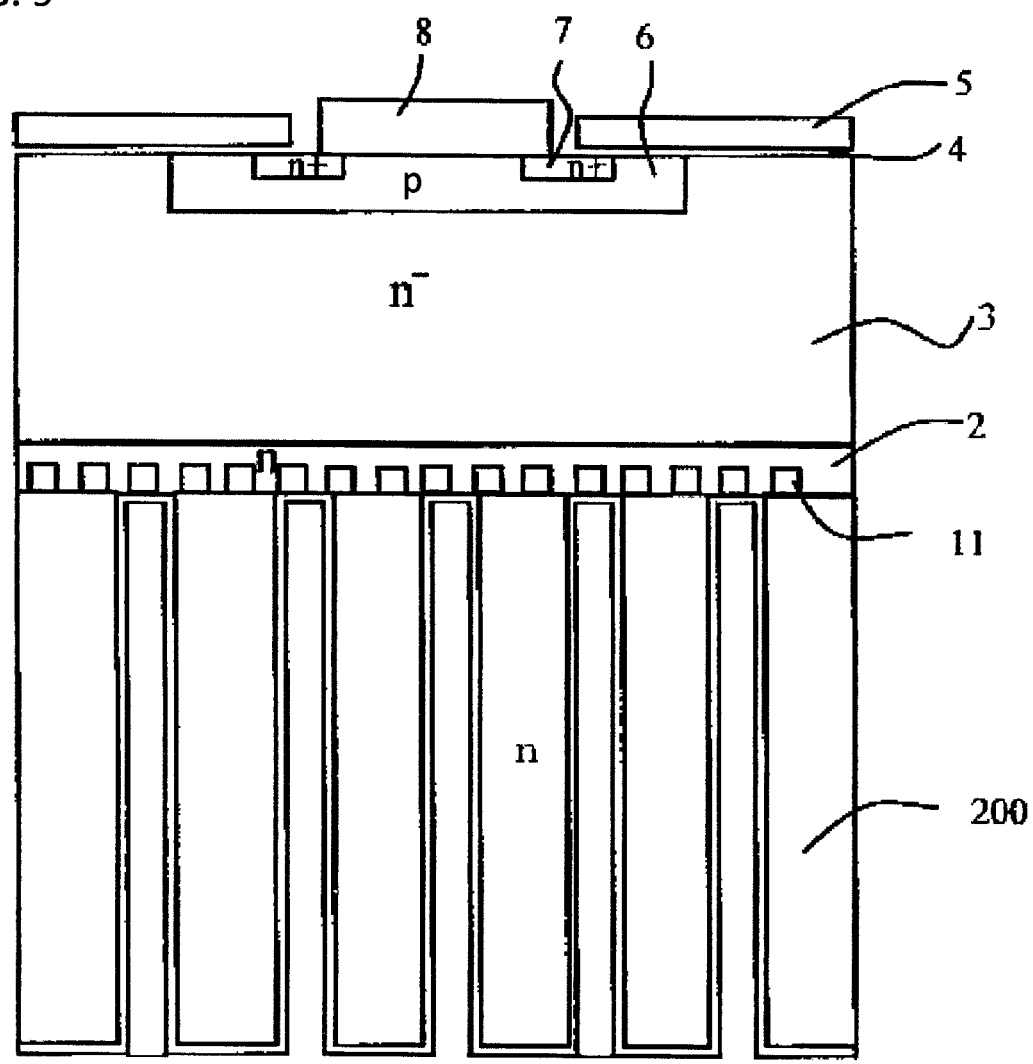
FIG. 9 is a sectional view of an important part of a MOSFET according to a third embodiment of the invention.

FIG. 9 is a sectional view of an important part of a MOSFET having a breakdown voltage of 600 V according to a third embodiment. As shown in FIG. 9, in the MOSFET according to the third embodiment, a silicon oxide film 11 is formed on a high-resistivity n-type silicon substrate 200 so as to have a selectively formed pattern. A 2.0-μm-thick epitaxial n-type layer 2 having an impurity concentration of $2.0 \times 10^{19}$ cm$^{-3}$ is formed on the silicon oxide film 11, and an epitaxial high-resistivity n$^-$ drift layer 3 is laid on the epitaxial n-type layer 2. To attain a breakdown voltage of 600 V with a sufficient margin, the impurity concentration and the thickness of the epitaxial high-resistivity n$^-$ drift layer 3 are set at $2.5 \times 10^{14}$ cm$^{-3}$ and 55 μm, respectively. Then, a 100-nm-thick gate oxide film 4 is formed and a gate electrode 5 is formed by forming and patterning a polysilicon layer. A p-type channel region 6 and n$^+$ source regions 7 are formed by ion implantation and thermal diffusion by a self-align method using the polysilicon gate electrode 5. After a BPSG interlayer insulating film (not shown) is formed, patterned, and subjected to heat treatment, a source electrode 8 is formed by sputtering a 5-μm-thick Al—Si (1%) film and patterning and heat-treating it. A 10-μm-thick polyimide layer is formed on the interlayer insulating film, patterned so that electrode pads (not shown) are exposed, and subjected to heat treatment. Then, trench etching is performed by RIE from the back side of the high-resistivity n-type silicon substrate 200. The etching is finished when the epitaxial n-type layer 2 is just exposed, by using the silicon oxide film 11 as an etching end point detection sensor. A MOSFET wafer process is finished by forming a back-side electrode (drain electrode). Although in the third embodiment the high-resistivity n-type silicon substrate 200 is used, a high-resistivity p-type silicon substrate 100 may be used instead. A detailed manufacturing process will not be described because it is similar to the detailed manufacturing process according to the first embodiment.

One hundred 8-inch-diameter MOSFET wafers having a breakdown voltage of 600 V were produced by the above manufacturing method and no wafer was broken during a wafer process to completion of a MOSFET wafer. It has thus been found that the manufacturing method according to the third embodiment is very high in productivity.

For comparison, 100 8-inch-diameter MOSFET wafers were produced by using the above-described conventional wafer thinning technique (FZ wafers were used). About 30 of the 100 wafers (wafer thickness: 65 μm) were broken. In particular, many of the about 30 wafers were broken while wafer handing, formation of a phosphorus impurity layer (back-surface n$^+$ layer), or electrode formation was done after grinding for thickness reduction. Whereas in the third embodiment the drain electrode is formed by vacuum evaporation, none of 100 8-inch-diameter wafers were broken even in the case where the drain electrode was formed by another method such as sputtering or plating.

The characteristics of the MOSFET formed according to the third embodiment were evaluated. The breakdown voltage was 703 V and the on-resistance RonA was a satisfactory value of 62 mΩ·cm$^2$ (at 25° C.). It was confirmed that one hundred 8-in-diameter trench-gate MOSFET wafers having a breakdown voltage of 600V were produced by the same method as the above manufacturing method, and no wafer was broken during a wafer process to completion of a MOSFET wafer.

Embodiment 4

Figure 10:
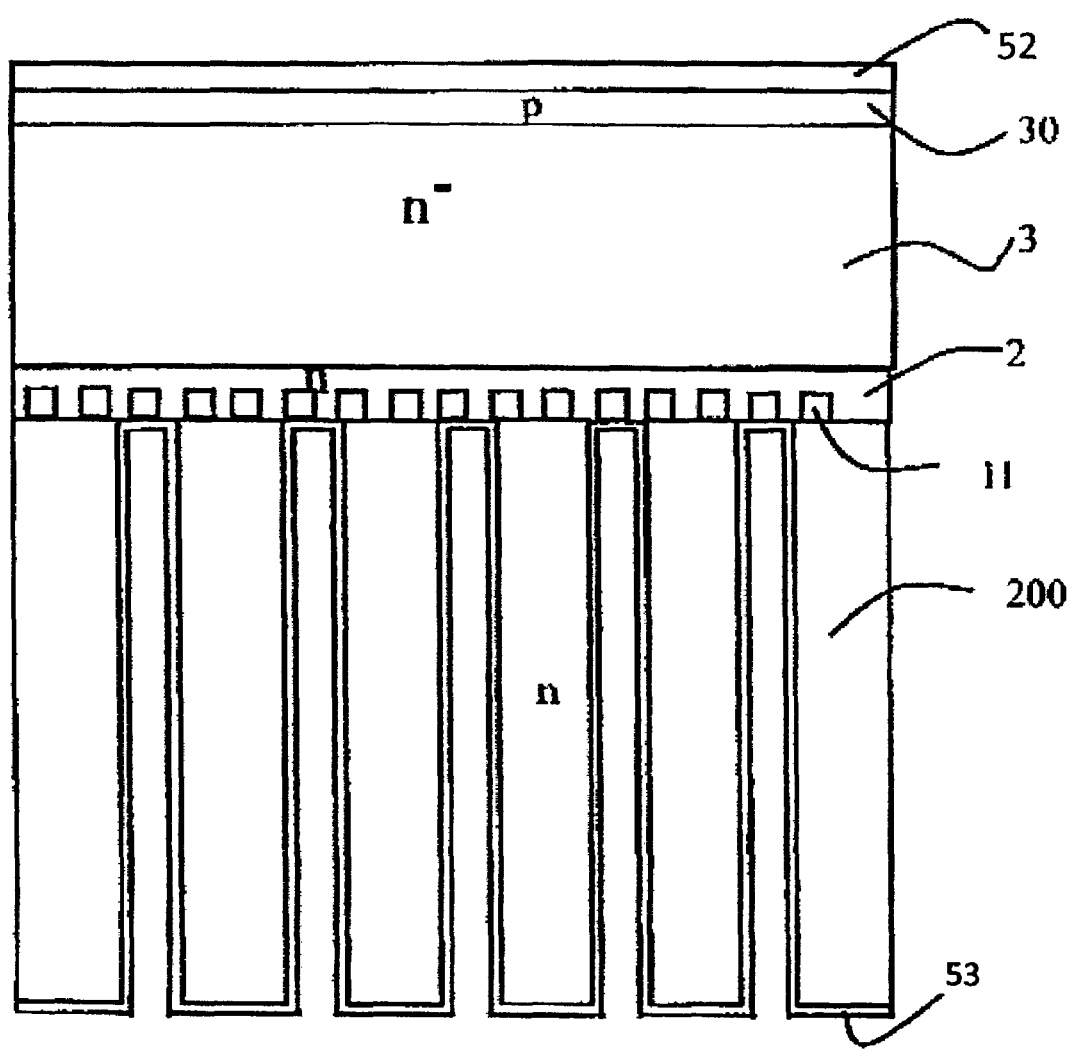
FIG. 10 is a sectional view of an important part of a pn junction diode according to a fourth embodiment of the invention.

FIG. 10 is a sectional view of an important part of a pn junction diode having a breakdown voltage of 600 V according to a fourth embodiment. As shown in FIG. 10, in the pn junction diode according to the fourth embodiment, a silicon oxide film 11 is formed on a high-resistivity n-type silicon substrate 200 so as to have a selectively formed pattern. A 2.0-μm-thick epitaxial n-type layer 2 having an impurity concentration of $2.0 \times 10^{17}$ cm$^{-3}$ is formed on the silicon oxide film 11, and an epitaxial high-resistivity n⁻ drift layer 3 is laid on the epitaxial n-type layer 2. To attain a breakdown voltage of 600 V with a sufficient margin, as in the first and second embodiments, the impurity concentration and the thickness of the epitaxial high-resistivity n⁻ drift layer 3 are set at $2.0 \times 10^{14}$ cm$^{-3}$ and 60 μm, respectively. Then, a p-type anode layer 30 is formed by performing ion implantation and thermal diffusion through the surface of the epitaxial high-resistivity n⁻ drift layer 3. An anode electrode 52 is formed on the anode layer 30 by sputtering a 5-μm-thick Al—Si (1%) film and performing heat treatment on it. Then, trench etching is performed by RIE from the back side of the high-resistivity n-type silicon substrate 200. The etching is finished when the epitaxial n-type layer 2 is just exposed, by using the silicon oxide film 11 as an etching end point detection sensor. A pn junction diode wafer process is finished by forming a back-side cathode electrode 53. Although in the fourth embodiment the high-resistivity n-type silicon substrate 200 is used, a high-resistivity p-type silicon substrate 100 may be used instead. A detailed manufacturing process will not be described because it is similar to the detailed manufacturing process according to the first embodiment.

One hundred 8-inch-diameter 600-V pn junction diode wafers were produced by the above manufacturing method and no wafer was broken before the end of the entire wafer process. It has thus been found that the manufacturing method according to the fourth embodiment is very high in productivity.

For comparison, 100 8-inch-diameter pn junction diode wafers were produced by using the above-described conventional wafer thinning technique (FZ wafers were used). About 20 of the 100 wafers (wafer thickness: 65 μm) were broken. In particular, many of the about 20 wafers were broken while wafer handling, formation of a phosphorus impurity layer (back-surface n-type layer), or electrode formation was done after grinding for thickness reduction. Whereas in the fourth embodiment the cathode electrode 53 is formed by vacuum evaporation, none of 100 8-inch-diameter wafers were broken even in the case where the cathode electrode 53 was formed by another method such as sputtering or plating.

The characteristics of the pn junction diode formed according to the fourth embodiment were evaluated. The breakdown voltage was 763 V, the on-voltage Vf was 1.5 V, and the reverse recovery characteristic trr was 70 ns (at 25° C.). As such, the characteristics of the pn junction diode formed according to the fourth embodiment were equivalent to those of the pn junction diode formed by using the above-described conventional wafer thinning technique and hence were satisfactory.

Embodiment 5

Figure 11:
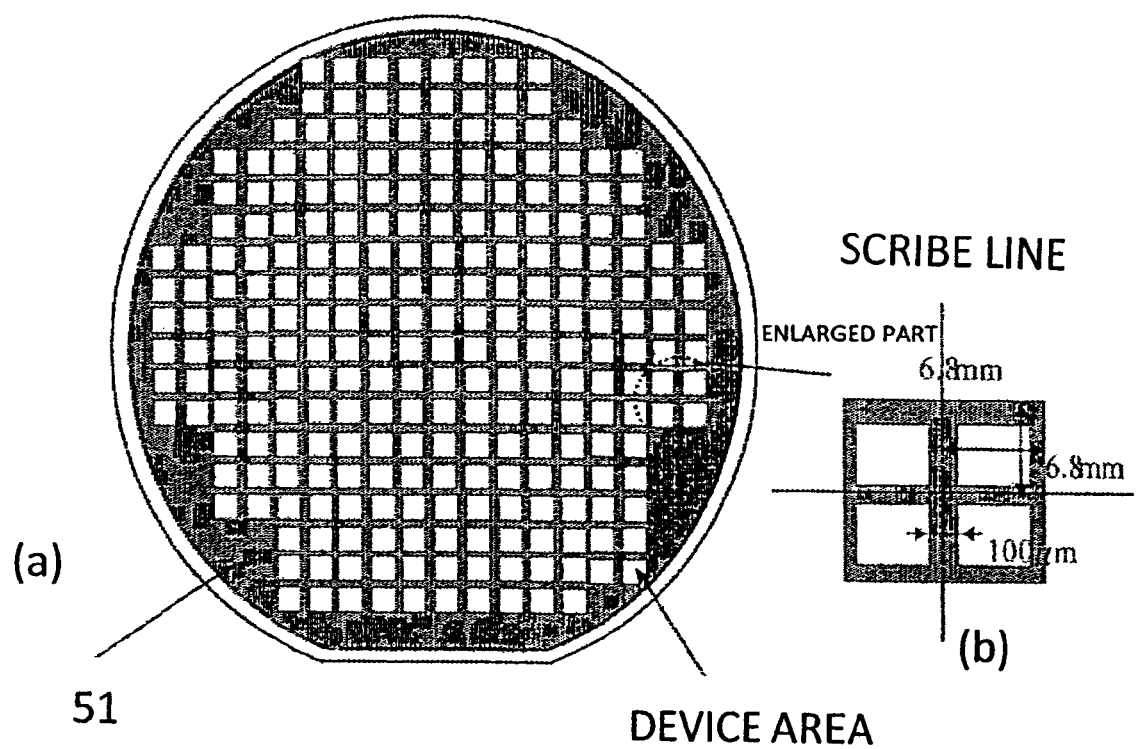
FIG. 11A is a plan view and showing a state that a lattice-shaped oxide film is formed on a silicon substrate in a fifth embodiment of the invention.
FIG. 11B is an enlarged plan view of part of FIG. 11A.

A fifth embodiment according to the invention will be described below with reference to FIGS. 11A and 11B to FIG. 17. The fifth embodiment is directed to an IGBT having a breakdown voltage of 600 V. FIG. 11A is a plan view of an 8-inch silicon substrate (wafer) to be used for formation of IGBTs according to the fifth embodiment and a patterned silicon oxide film 51 formed thereon. As shown in an enlarged view of FIG. 11B, since the chip size is 6.8 mm square, the silicon oxide film 51 is formed in lattice form at a repetition pitch of 6.8 mm. The semiconductor functional portion of an IGBT is formed in each oxide-film-removed area that is enclosed by the lattice-shaped silicon oxide film 51. The center lines of the lattice-shaped silicon oxide film 51 are scribe lines. In FIG. 11A which shows the entire wafer, the chip size is exaggerated relative to the wafer. If the oxide film 51, which serves for etching end point detection, were formed also at the periphery of the wafer, the oxide film 51 would be exposed and might not serve properly for etching end point detection. In view of this, it is necessary that the oxide film 51 be formed inside a circle that is spaced inward from the wafer periphery by at least about 20 μm.

Figures 12A, 12B:
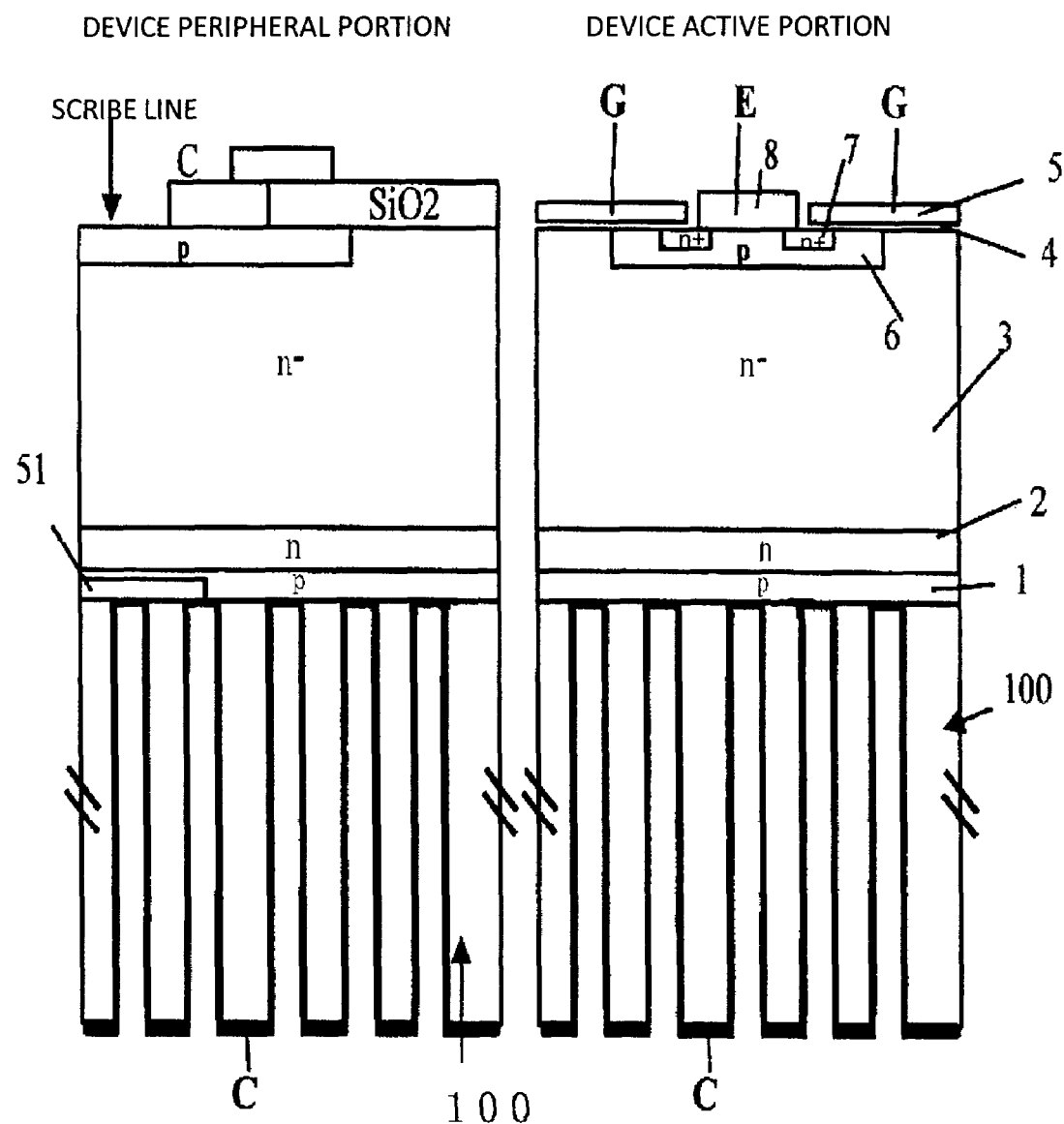
FIGS. 12A and 12B are sectional views of important parts of an IGBT according to the fifth embodiment of the invention.
Figure 13:
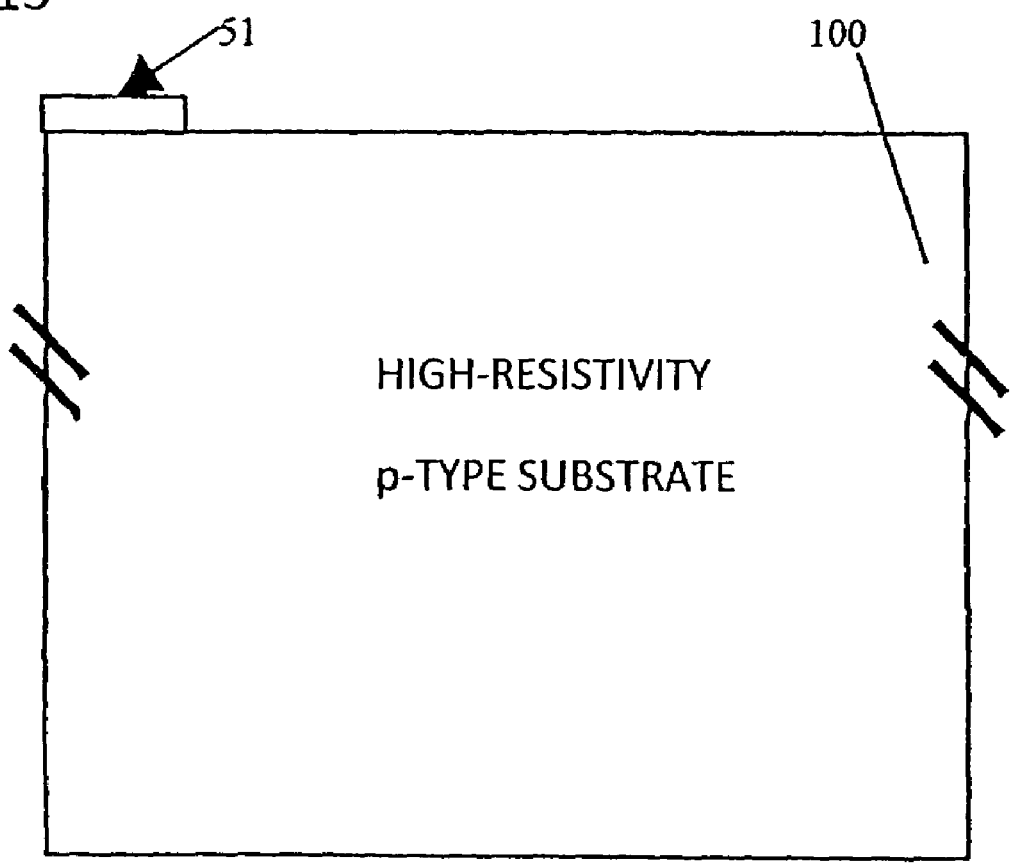

FIGS. 12A and 12B are sectional views of important parts of an IGBT according to the fifth embodiment. FIG. 12A shows a device peripheral portion of the IGBT and FIG. 12B shows a device active portion (where a main current of the IGBT flows) of the same IGBT. As shown in FIGS. 12A and 12B, the fifth embodiment is different from the first to fourth embodiments in that the silicon oxide film 51 is formed partially, that is, only in the device peripheral portions of the chips formed on a high-resistivity p-type silicon substrate 100; that is, the silicon oxide film 51 is not formed in the device active portions.

A 0.6-μm-thick p-type collector layer 1 having an impurity concentration of $3.0 \times 10^{17}$ cm$^{-3}$ and a 2.0-μm-thick n-type layer 2 having an impurity concentration of $2.0 \times 10^{16}$ cm$^{-3}$ are laid in this order on a high-resistivity p-type silicon substrate 100, and a high-resistivity n⁻ drift layer 3 is laid on the n-type layer 2. To attain a breakdown voltage of 600 V with a sufficient margin, the impurity concentration and the thickness of the high-resistivity n⁻ drift layer 3 are set at $2.0 \times 10^{14}$ cm$^{-3}$ and 60 μm, respectively. Then, as in the first embodiment, a 100-nm-thick gate oxide film 4 is formed and a gate electrode 5 is formed by forming and patterning a polysilicon layer. A p-type channel region 6 and n⁺ emitter regions 7 are formed by ion implantation and thermal diffusion by a self-align method using the polysilicon gate electrode 5. After a BPSG interlayer insulating film (not shown) is formed, patterned, and subjected to heat treatment, an emitter electrode 8 is formed by sputtering a 5-μm-thick Al—Si (1%) film and patterning and heat-treating it. A 10-μm-thick polyimide layer (not shown) is formed on the interlayer insulating film, patterned so that electrode pads are exposed, and subjected to heat treatment. Then, trench etching is performed by RIE from the back side of the high-resistivity p-type silicon substrate 100. The etching is finished when the p-type collector layer 1 is just exposed, by using the silicon oxide film 51 as an etching end point detection sensor. An IGBT wafer is completed by forming a back-side metal electrode in the same manner as in the first embodiment. Although in the fifth embodiment the high-resistivity p-type silicon substrate 100 is used, a high-resistivity n-type silicon substrate 200 may be used instead.

The manufacturing method of an IGBT according to the fifth embodiment will be described below in detail. As shown in the plan views of FIGS. 11A and 11B and a sectional view of FIG. 13, an 8-inch-diameter high-resistivity p-type silicon substrate 100 is prepared and a 0.2-μm-thick silicon oxide film is formed thereon. The silicon oxide film is patterned so that a lattice-shaped oxide film 51 having a pitch (e.g., 6.8 mm) that is suitable for an intended chip size is left. In the fifth embodiment, the width of the narrow stretches of the oxide film 51 is set at 100 μm. The semiconductor functional portion of each IGBT is formed in a 6.7-mm square where the silicon oxide film was removed.

Then, as shown in FIGS. 14A and 14B, a 0.6-μm-thick p-type collector layer 1 having an impurity concentration of $3.0 \times 10^{17}$ cm$^{-3}$ is formed on the high-resistivity p-type silicon substrate 100 by epitaxial silicon growth which is a known technique. Boron is used as the impurity. Then, a 3.0-μm-thick n-type layer 2 having an impurity concentration of $2.0 \times 10^{16}$ cm$^{-3}$ and a high-resistivity n$^-$ drift layer 3 having an impurity concentration of $2.0 \times 10^{14}$ cm$^{-3}$ are formed on the p-type collector layer 1. Phosphorus is used as the n-type impurity. Then, a 100-nm-thick silicon oxide film is formed as a gate oxide film 4 and a gate electrode 5 is formed by forming and patterning a 0.5-μm-thick polysilicon layer. Then, a p-type channel region 6 of about 2.5 μm in depth is formed by ion implantation and thermal diffusion. The dose of the impurity which is boron is $8.0 \times 10^{13}$ cm$^{-2}$ and the thermal diffusion temperature and time are 1,150° C. and 2 hours. Then, 0.4-μm-thick n$^+$ emitter regions 7 are formed by implanting arsenic ions at a dose of $5.0 \times 10^{15}$ cm$^{-2}$. Then, a 1.0-μm-thick BPSG interlayer insulating film (not shown) is deposited, patterned, and subjected to heat treatment of 1,000° C., and an emitter electrode 8 is formed by sputtering a 5-μm-thick Al—Si (1%) film and patterning and performing heat treatment of 400° C. on it. Then, after a 10-μm-thick polyimide surface protective film (not shown) is formed on the device surface, it is patterned so as to form windows for exposing the emitter electrode 8 and a gate electrode pad (not shown) and then subjected to heat treatment of 300° C. The interlayer insulating film and the surface protective film are omitted in FIGS. 14A and 14B.

Subsequently, as shown in FIGS. 15A and 15B, a 1.6-μm-thick oxide film is grown on the back surface of the high-resistivity substrate 100, and an oxide film mask 12 having stripe patterns that are 5 μm in width and are spaced from each other by 5 μm are formed by photolithography and etching. Then, trench etching is performed from the back side of the high-resistivity substrate 100 by RIE. In the fifth embodiment, to shorten the trench etching time, the oxide film mask 12 is formed and trench etching is performed after the entire back surface of the high-resistivity substrate 100 is ground to reduce the thickness to 250 μm, that is, in such a range that the wafer will not be broken in a later wafer process. It is important to stop the trench etching when it just reaches the p-type collector layer 1. Since as mentioned above the thickness of the p-type collector layer 1 is set at the relatively small value of 0.6 μm to improve the electrical characteristics, it is difficult to stop the etching when it just reaches the surface of the p-type collector layer 1. However, in the embodiment, since the lattice-shaped silicon oxide film 51 of 0.2 μm in thickness and 100 μm in width is formed only in the area where the IGBT functional portions are not formed, the silicon oxide film 51 starts to be etched at the same time as the etching fronts of the trench etching reach the p-type collector layer 1.

Figure 16A:
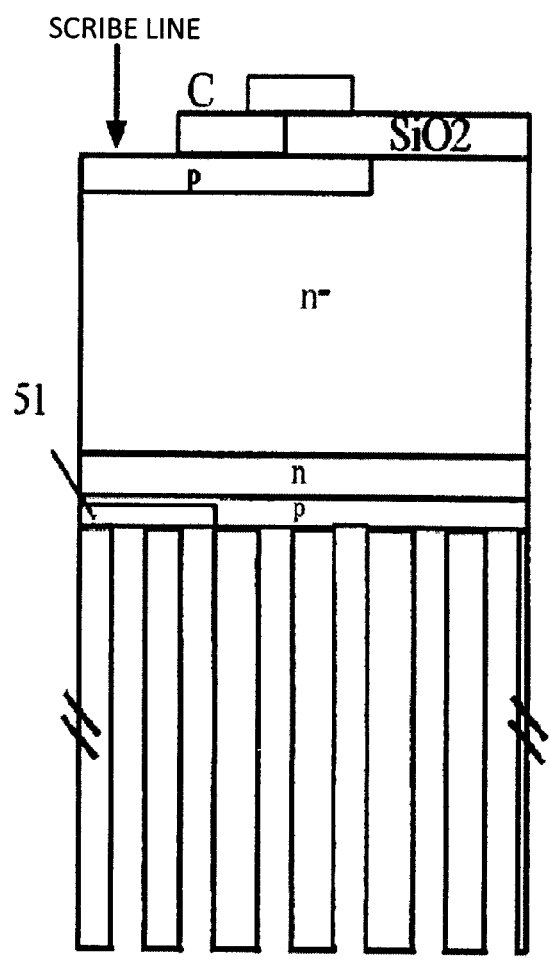
Figure 16B:
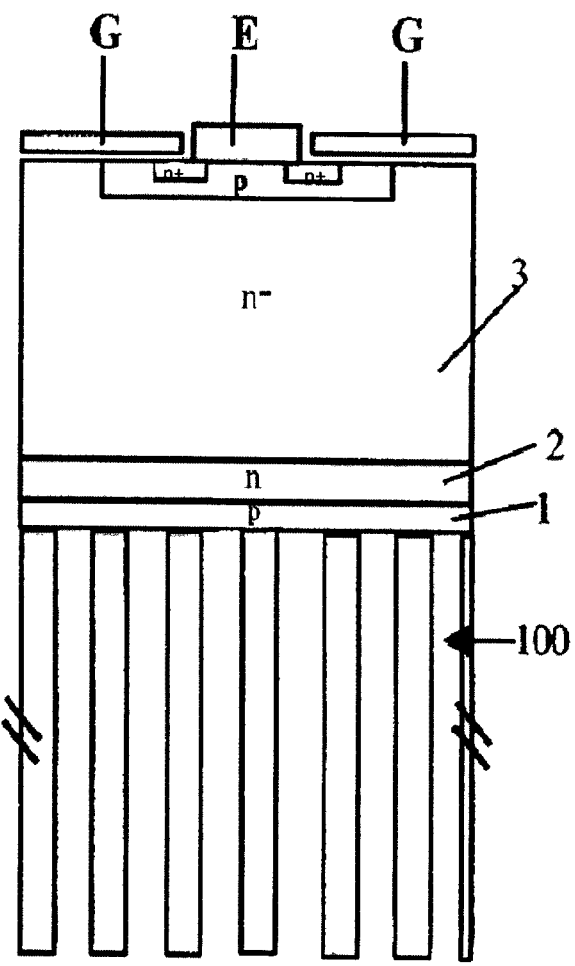

Therefore, as shown in the sectional views of FIGS. 16A and 16B, the trench etching can be stopped when the etching fronts just reach the surface of the p-type collector layer 1 by stopping the etching upon detection of rapid increase of oxygen during the etching. Subsequently, as shown in FIGS. 12A and 12B, Al, Ti, Ni, and Au metal films are formed on the bottom surfaces and the side surfaces of the trenches and the entire back surface of the wafer by vacuum evaporation. An IGBT wafer is thus completed.

The 100-μm-wide narrow stretches of the lattice-shaped silicon oxide film 51 extend along the scribe lines (i.e., cutting lines for dividing the wafer into chips) and the silicon oxide film 51 is formed only around the IGBT semiconductor functional portions, most of the trenches serve to allow that portion of the p-type collector layer 1 which is located in the IGBT semiconductor functional portion to reliably contact the metal film (collector electrode) which is formed after the trench formation. Therefore, unlike in the first to fourth embodiments, the silicon oxide film 51 does not influence the conduction at all. A lifetime control process for increasing the switching speed is not applied to the IGBT according to the embodiment. One hundred 8-inch-diameter IGBT wafers having a breakdown voltage of 600 V were produced by the above manufacturing method and no wafer was broken during a wafer process to completion of an IGBT wafer. It has thus been found that the manufacturing method according to the fifth embodiment is very high in productivity.

For comparison, 100 8-inch-diameter IGBT wafers were produced by using the above-described conventional wafer thinning technique (FZ wafers were used). About 35 of the 100 wafers (wafer thickness: 65 μm) were broken while wafer handing, formation of an impurity layer through the back surface, or electrode formation was done after grinding for thickness reduction. Whereas in the fifth embodiment the collector electrode is formed by vacuum evaporation, none of 100 8-inch-diameter wafers were broken even in the case where the collector electrode was formed by another method such as sputtering or plating.

Figure 17:
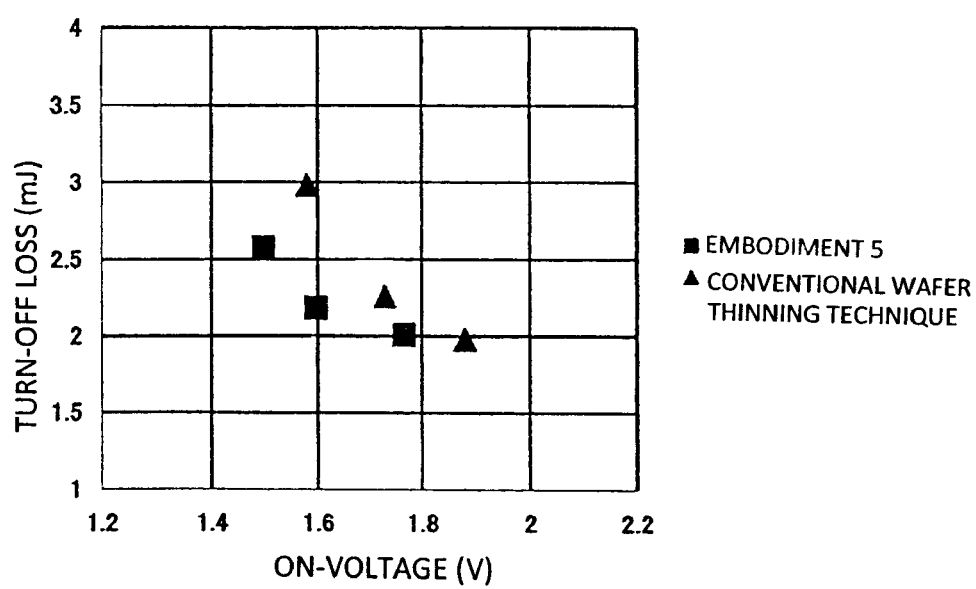
FIG. 17 shows a result of comparison between on-voltage/turn-off loss tradeoff characteristics of an IGBT formed according to the fifth embodiment and an IGBT formed by using the conventional wafer thinning technique.

FIG. 17 shows a result of comparison between electrical characteristics (on-voltage/turn-off loss tradeoff characteristics) of a planar-gate IGBT formed according to the fifth embodiment and that formed by the above-described conventional wafer thinning process. The chip size was 6.8 mm square, the device rating was 600 V/100 A, and the current density rating was 300 A/cm$^2$. The IGBT formed according to the fifth embodiment exhibited a breakdown voltage of 730 V which was sufficiently high for a 600-V device like the IGBT formed by the conventional wafer thinning process (breakdown voltage: 726 V) and a conventional punchthrough IGBT formed by using a wafer in which epitaxial growth was performed on a thick p$^+$ substrate (breakdown voltage: 702 V). It is seen from FIG. 17 that the tradeoff characteristic of the IGBT formed according to the fifth embodiment is approximately the same as or a little better than that of the IGBT formed by the conventional wafer thinning process and hence is very good. It was also found that the conventional punchthrough IGBT had an on-voltage of 2.2 V and a turn-off loss of 6.2 mJ, which are out of the range of the FIG. 17 graph and hence mean that the loss is large. The three points (see FIG. 17) of the tradeoff characteristic of the IGBT formed according to the fifth embodiment are evaluation results corresponding to the above-mentioned impurity concentration $3.0 \times 10^{17}$ cm$^{-3}$ of the p-type collector layer 1 plus two additional impurity concentrations $2.0 \times 10^{17}$ cm$^{-3}$ and $4.0 \times 10^{17}$ cm$^{-3}$. The measurement temperature was 125° C. It is seen from the above discussion that the IGBT manufacturing method according to the fifth embodiment has high productivity and an IGBT manufactured by that method exhibits very good electrical characteristics.

Embodiment 6

FIGS. 18A and 18B are sectional views of important parts of an IGBT having a breakdown voltage of 600 V according to a sixth embodiment. In the IGBT according to the sixth embodiment, as in the IGBT according to the fifth embodiment, a lattice-shaped silicon oxide film 51 is formed on an 8-inch-diameter high-resistivity p-type silicon substrate 100 in such a manner as to be suitable for a chip size which is 6.8 mm square. A 0.6-μm-thick p-type collector layer 1 having an impurity concentration of $3.0 \times 10^{17}$ cm$^{-3}$ and a 3.0-μm-thick n-type layer 2 having an impurity concentration of $2.0 \times 10^{16}$ cm$^{-3}$ are formed on the high-resistivity p-type substrate 100. A high-resistivity n⁻ drift layer 3 is laid on the n-type layer 2. The silicon oxide film 51 is also formed in a wafer peripheral area where no IGBT chips are to be formed. Although in the sixth embodiment the p-type silicon substrate 100 is used, a high-resistivity n-type silicon substrate 200 may be used instead. To attain a breakdown voltage of 600 V with a sufficient margin, as in the first embodiment, the impurity concentration and the thickness of the high-resistivity n⁻ drift layer 3 are set at $2.0 \times 10^{14}$ cm$^{-3}$ and 60 μm, respectively. Then, to form a trench gate structure, 1.2-μm-wide trenches 20 are formed at regular intervals (pitch: 5 μm) at a depth of 4.5 μm. Forming the trenches 20 with sufficient care allows them to be formed so that their bottoms have a radius of curvature of 0.6 μm. After a 100-nm-thick gate oxide film 21 is grown on the inside surfaces of the trenches 20, the trenches 20 are filled with polysilicon gate electrodes 22, a p-type channel region 23 and n⁺ emitter regions 24 are formed. And an interlayer insulating film (not shown), an emitter electrode 25, and a passivation film (not shown) are formed in the same manner as in the first and second embodiments. The thickness and the composition of the electrode film and the heat treatment temperature for its formation are set the same as in the first and second embodiments. A device is formed by using the same wafer back side forming process as in the first and second embodiments with an exception that the pattern of the silicon oxide film 51 which serves as an etching end point detection sensor in forming back-side trenches is different than in the first and second embodiments.

One hundred 8-inch-diameter, 600-V IGBT wafers were produced by the above manufacturing method. Although a lifetime control process for increasing the switching speed was not employed, no wafer was broken during a process to completion of an IGBT wafer. It has thus been found that the manufacturing method according to the sixth embodiment is very high in productivity like that according to the first embodiment.

Figure 19:
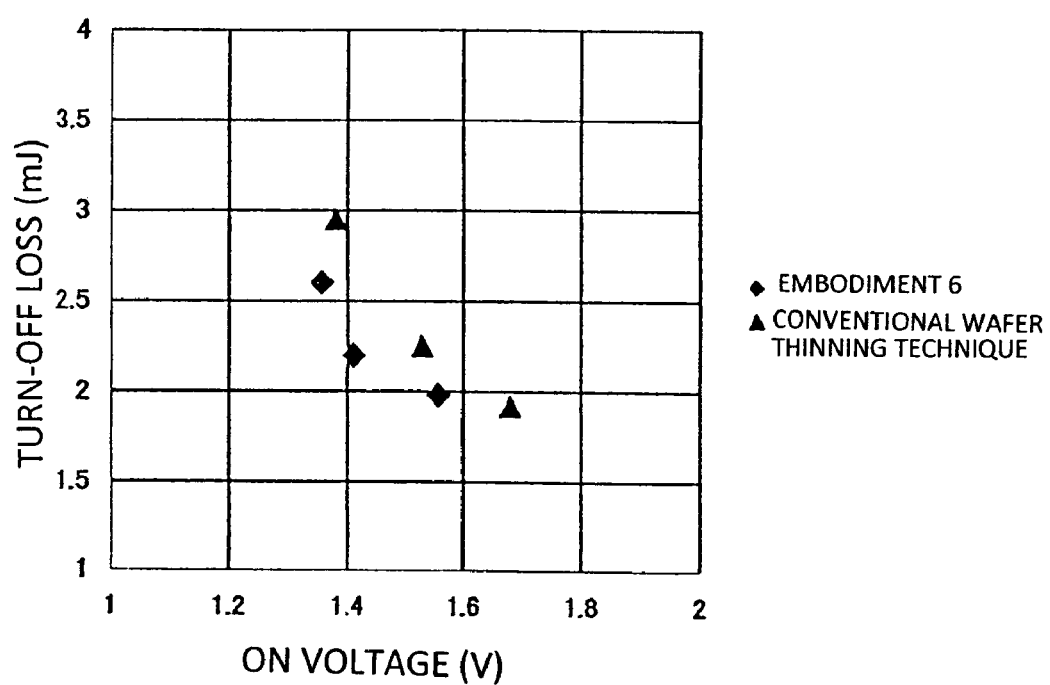
FIG. 19 shows a result of comparison between on-voltage/turn-off loss tradeoff characteristics of an IGBT formed according to the sixth embodiment and an IGBT formed by using the conventional wafer thinning technique.

FIG. 19 shows a result of comparison between electrical characteristics (on-voltage/turn-off loss tradeoff characteristics) of a trench-gate IGBT formed according to the sixth embodiment and that formed by the above-described conventional wafer thinning process. The chip size was 6.8 mm square, the device rating was 600 V/100 A, and the current density rating was 300 A/cm². The IGBT formed according to the sixth embodiment exhibited a breakdown voltage of 723 V which was sufficiently high for a 600-V device like the IGBT formed by the conventional wafer thinning process which had a breakdown voltage of 722 V. It is seen from FIG. 19 that the tradeoff characteristic of the IGBT formed according to the sixth embodiment is approximately the same as or a little better than that of the IGBT formed by the conventional wafer thinning process and hence is very good. The conventional punchthrough trench-gate IGBT had an on-voltage of 2.0 V and a turn-off loss of 6.1 mJ, which are out of the range of the FIG. 19 graph and hence means that the loss is large. The three points (see FIG. 19) of the tradeoff characteristic of the IGBT formed according to the sixth embodiment are evaluation results corresponding to the above-mentioned impurity concentration $3.0 \times 10^{17}$ cm$^{-3}$ of the p-type collector layer 1 plus two additional impurity concentrations $2.0 \times 10^{17}$ cm$^{-3}$ and $4.0 \times 10^{17}$ cm$^{-3}$. The measurement temperature was 125° C. It is seen from the above discussion that the IGBT manufacturing method according to the sixth embodiment has high productivity and an IGBT manufactured by that method exhibits very good electrical characteristics.

Embodiment 7

FIGS. 20A and 20B are sectional views of important parts of a MOSFET having a breakdown voltage of 600 V according to a seventh embodiment. As shown in FIGS. 20A and 20B, in the MOSFET according to the seventh embodiment, a lattice-shaped silicon oxide film 51 is formed on a high-resistivity n-type silicon substrate 200 in such a manner as to be suitable for a chip size which is 6.8 mm square. A 2.0-μm-thick n-type layer 2 having an impurity concentration of $2.0 \times 10^{19}$ cm$^{-3}$ is formed on the silicon substrate 200, and a high-resistivity n⁻ drift layer 3 is laid on the n-type layer 2. To attain a breakdown voltage of 600 V with a sufficient margin, the impurity concentration and the thickness of the high-resistivity n⁻ drift layer 3 are set at $2.5 \times 10^{14}$ cm$^{-3}$ and 55 μm, respectively. Then, a 100-nm-thick gate oxide film 4 is formed and a gate electrode 5 is formed by forming and patterning a polysilicon layer. A p-type channel region 6 and n⁺ source regions 7 are formed by ion implantation and thermal diffusion by a self-align method using the polysilicon gate electrode 5. After a BPSG interlayer insulating film (not shown) is formed, patterned, and subjected to heat treatment, a source electrode 8 is formed by sputtering a 5-μm-thick Al—Si (1%) film and patterning and heat-treating it. A 10-μm-thick polyimide layer is formed on the interlayer insulating film, patterned so that electrode pads (not shown) are exposed, and subjected to heat treatment. Then, trench etching is performed by RIE from the back side of the high-resistivity n-type silicon substrate 200. The etching is finished when the n-type layer 2 is just exposed, by using the silicon oxide film 51 as an etching end point detection sensor. A MOSFET wafer is completed by forming a back-side electrode in the same manner as in the third embodiment.

Although in the seventh embodiment the high-resistivity n-type silicon substrate 200 is used, a high-resistivity p-type silicon substrate 100 may be used instead. A detailed manufacturing process will not be described because it is similar to the detailed manufacturing processes according to the first, second, and third embodiments.

One hundred 8-inch-diameter MOSFET wafers having a breakdown voltage of 600 V were produced by the above manufacturing method and no wafer was broken during a wafer process to completion of a MOSFET wafer. It has thus been found that the manufacturing method according to the seventh embodiment is very high in productivity.

For comparison, 100 8-inch-diameter MOSFET wafers were produced by using the above-described conventional wafer thinning technique (FZ wafers were used). About 30 of the 100 wafers (wafer thickness: 65 μm) were broken while wafer handing, formation of a phosphorus impurity layer (back-surface n layer), or electrode formation was done after grinding for thickness reduction. Whereas in the seventh embodiment the drain electrode is formed by vacuum evaporation, none of 100 8-inch-diameter wafers were broken even in the case where the drain electrode was formed by another method such as sputtering or plating.

The characteristics of the MOSFET formed according to the seventh embodiment were evaluated. The breakdown voltage was 703 V and the on-resistance RonA was a satisfactory value of 62 mΩ·cm² (at 25° C.). It was confirmed that one hundred 8-inch-diameter trench-gate MOSFET wafers having a breakdown voltage of 600 V were produced by the same method as the above manufacturing method, and no wafer was broken during a wafer process to completion of a MOSFET wafer.

Embodiment 8

FIGS. 21A and 21B are sectional views of important parts of a pn junction diode having a breakdown voltage of 600 V according to an eighth embodiment. As shown in FIGS. 21A and 21B, in the pn junction diode according to the eighth embodiment, a lattice-shaped silicon oxide film 51 is formed on a high-resistivity n-type silicon substrate 200 in such a manner as to be suitable for a chip size which is 4 mm square. A 2.0-μm-thick n-type layer 2 having an impurity concentration of $2.0 \times 10^{17}$ cm$^{-3}$ is formed on the silicon substrate 200, and a high-resistivity n⁻ drift layer 3 is laid on the n-type layer 2. To attain a breakdown voltage of 600 V with a sufficient margin, as in the fourth embodiment, the impurity concentration and the thickness of the high-resistivity n⁻ drift layer 3 are set at $2.0 \times 10^{14}$ cm$^{-3}$ and 60 μm, respectively. Then, a p-type anode region 30 is formed by ion implantation and thermal diffusion. After a BPSG interlayer insulating film is formed, patterned, and subjected to heat treatment, an anode electrode 52 is formed by sputtering a 5-μm-thick Al—Si (1%) film and patterning and heat-treating it. Then, a 10-μm-thick polyimide layer is formed on the interlayer insulating film, patterned so that electrode pads are exposed, and subjected to heat treatment. Then, trench etching is performed by RIE from the back side of the high-resistivity n-type silicon substrate 200. The etching is finished when the n-type layer 2 is just exposed. A diode is completed by forming a back-side cathode electrode 53. Although in the eighth embodiment the high-resistivity n-type silicon substrate 200 is used, a high-resistivity p-type silicon substrate 100 may be used instead. A detailed manufacturing process will not be described because it is similar to the detailed manufacturing process according to the first embodiment.

One hundred 8-inch-diameter pn junction diode wafers having a breakdown voltage of 600 V were produced by the above manufacturing method and no wafer was broken during a wafer process to completion of a diode wafer. It has thus been found that the manufacturing method according to the eighth embodiment is very high in productivity.

For comparison, 100 8-inch-diameter pn junction diode wafers were produced by using the above-described conventional wafer thinning technique (FZ wafers were used). About 20 of the 100 wafers (wafer thickness: 65 μm) were broken while wafer handing, formation of a phosphorus impurity layer (back-surface n-type layer 2), or electrode formation was done after grinding for thickness reduction. Whereas in the eighth embodiment the cathode electrode 53 is formed by vacuum evaporation, none of 100 8-inch-diameter wafers were broken even in the case where the cathode electrode 53 was formed by another method such as sputtering or plating.

The characteristics of the pn junction diode formed according to the eighth embodiment were evaluated. The breakdown voltage was 763 V, the on-voltage Vf was 1.5 V, and the reverse recovery characteristic trr was 70 ns (at 25° C.). As such, the characteristics of the pn junction diode formed according to the eighth embodiment were equivalent to those of the pn junction diode formed by using the above-described conventional wafer thinning technique and hence were satisfactory.

The invention has been described with reference to certain preferred embodiments thereof. It will be understood, however, that modifications and variations are possible within the scope of the appended claims.

This application is based on, and claims priority to, Japanese Patent Application No: 2007-285021, filed on Nov. 1, 2007 and Japanese Patent Application No: 2008-066985, filed on Mar. 17, 2008. The disclosure of the priority applications, in their entirety, including the drawings, claims, and the specification thereof, are incorporated herein by reference.

What is claimed is:

1. A manufacturing method of a semiconductor device, comprising the steps of:
   forming an insulating film having a prescribed repetition pattern on one surface of a semiconductor substrate;
   depositing a semiconductor layer on the one surface of the semiconductor substrate;
   forming semiconductor device portions in the semiconductor layer in a prescribed repetition pattern;
   forming trenches from the other surface of the semiconductor substrate at such a depth that the trenches come into contact with the semiconductor layer in such a manner that plural trenches are formed for each semiconductor device portion and that at least parts of the insulating film are exposed through bottoms of the trenches; and
   covering inside surfaces of the trenches and the other surface of the semiconductor substrate with a metal electrode.

2. The manufacturing method of a semiconductor device according to claim 1, wherein the at least parts of the insulating film have such a pattern as to be exposed through the bottoms of all the trenches.

3. The manufacturing method of a semiconductor device according to claim 2, wherein the insulating film has a lattice-shaped, stripe-shaped, or dot-shaped repetition pattern.

4. The manufacturing method of a semiconductor device according to claim 1, wherein the insulating film has a lattice-shaped repetition pattern whose narrow stretches extend along scribe lines, the semiconductor device portions forming step is a step of forming a semiconductor device portion in each part of the semiconductor layer that is surrounded by the lattice-shaped insulating film, and in the trenches forming step at least parts of the lattice-shaped repetition pattern are exposed through the bottoms of the trenches.

5. The manufacturing method of a semiconductor device according to claim 3, wherein the trenches forming step uses the insulating film as an end point detection film for etching for forming trenches from the other surface of the semiconductor substrate at such a depth that the trenches come into contact with the semiconductor layer.

6. The manufacturing method of a semiconductor device according to claim 4, wherein the trenches forming step uses the insulating film as an end point detection film for etching for forming trenches from the other surface of the semiconductor substrate at such a depth that the trenches come into contact with the semiconductor layer.

7. The manufacturing method of a semiconductor device according to claim 5, wherein:

the semiconductor layer is such that a first semiconductor layer of a first conductivity type that is lower in resistivity than the semiconductor substrate, a second semiconductor layer of a second conductivity type, and a third semiconductor layer of the second conductivity type that is higher in resistivity than the second semiconductor layer that are epitaxially grown and are arranged in this order from the side of the semiconductor substrate; and each of the semiconductor device portions has, as main components, a channel region of the first conductivity type that is formed selectively in the third semiconductor layer adjacent to its surface and an emitter region of the second conductivity type that is formed selectively in the channel region adjacent to its surface, and also has a gate electrode formed on a surface portion of the channel region that is located between a surface portion of the emitter region and a surface portion of the third semiconductor layer with a gate insulating film interposed in between and an emitter electrode that is in contact with both of a surface portion of the channel region and a surface portion of the emitter region.

8. The manufacturing method of a semiconductor device according to claim 6, wherein:

the semiconductor layer is such that a first semiconductor layer of a first conductivity type that is lower in resistivity than the semiconductor substrate, a second semiconductor layer of a second conductivity type, and a third semiconductor layer of the second conductivity type that is higher in resistivity than the second semiconductor layer that are epitaxially grown and are arranged in this order from the side of the semiconductor substrate; and each of the semiconductor device portions has, as main components, a channel region of the first conductivity type that is formed selectively in the third semiconductor layer adjacent to its surface and an emitter region of the second conductivity type that is formed selectively in the channel region adjacent to its surface, and also has a gate electrode formed on a surface portion of the channel region that is located between a surface portion of the emitter region and a surface portion of the third semiconductor layer with a gate insulating film interposed in between and an emitter electrode that is in contact with both of a surface portion of the channel region and a surface portion of the emitter region.

9. The manufacturing method of a semiconductor device according to claim 7, wherein the gate electrode is formed, with the gate insulating film interposed in between, on inside surfaces of trenches that penetrate through the channel region from surfaces of emitter regions and reach the third semiconductor layer.

10. The manufacturing method of a semiconductor device according to claim 8, wherein the gate electrode is formed, with the gate insulating film interposed in between, on inside surfaces of trenches that penetrate through the channel region from surfaces of emitter regions and reach the third semiconductor layer.

11. The manufacturing method of a semiconductor device according to claim 5, wherein:

the semiconductor substrate is a high-resistivity substrate of a second conductivity type;

the semiconductor layer is such that a fourth semiconductor layer of the second conductivity type that is lower in resistivity than the semiconductor substrate and a fifth semiconductor layer of the second conductivity type that is higher in resistivity than the fourth semiconductor layer are epitaxially grown and are arranged in this order from the side of the semiconductor substrate; and each of the semiconductor device portions has, as main components, a channel region of a first conductivity type that is formed selectively in the fifth semiconductor layer adjacent to its surface and a source region of the second conductivity type that is formed selectively in the channel region adjacent to its surface, and also has a gate electrode formed on a surface portion of the channel region that is located between a surface portion of the source region and a surface portion of the fifth semiconductor layer with a gate insulating film interposed in between and a source electrode that is in contact with both of a surface portion of the channel region and a surface portion of the source region.

12. The manufacturing method of a semiconductor device according to claim 6, wherein:

the semiconductor substrate is a high-resistivity substrate of a second conductivity type;

the semiconductor layer is such that a fourth semiconductor layer of the second conductivity type that is lower in resistivity than the semiconductor substrate and a fifth semiconductor layer of the second conductivity type that is higher in resistivity than the fourth semiconductor layer are epitaxially grown and are arranged in this order from the side of the semiconductor substrate; and each of the semiconductor device portions has, as main components, a channel region of a first conductivity type that is formed selectively in the fifth semiconductor layer adjacent to its surface and a source region of the second conductivity type that is formed selectively in the channel region adjacent to its surface, and also has a gate electrode formed on a surface portion of the channel region that is located between a surface portion of the source region and a surface portion of the fifth semiconductor layer with a gate insulating film interposed in between and a source electrode that is in contact with both of a surface portion of the channel region and a surface portion of the source region.

13. The manufacturing method of a semiconductor device according to claim 11, wherein the gate electrode is formed, with the gate insulating film interposed in between, on inside surfaces of trenches that penetrate through the channel region from surfaces of source regions and reach the fifth semiconductor layer.

14. The manufacturing method of a semiconductor device according to claim 12, wherein the gate electrode is formed, with the gate insulating film interposed in between, on inside surfaces of trenches that penetrate through the channel region from surfaces of source regions and reach the fifth semiconductor layer.

15. The manufacturing method of a semiconductor device according to claim 5, wherein:

the semiconductor substrate is a high-resistivity substrate of a second conductivity type; and the semiconductor layer is such that a sixth semiconductor cathode layer of the second conductivity type that is lower in resistivity than the semiconductor substrate and a seventh semiconductor layer of the second conductivity type that is higher in resistivity than the sixth semiconductor layer are epitaxially grown and are arranged in this order from the side of the semiconductor substrate, and that a low-resistivity eighth semiconductor anode layer of a first conductivity type is formed as a surface layer of the seventh semiconductor layer.

16. The manufacturing method of a semiconductor device according to claim 6, wherein:

the semiconductor substrate is a high-resistivity substrate of a second conductivity type; and the semiconductor layer is such that a sixth semiconductor cathode layer of the second conductivity type that is lower in resistivity than the semiconductor substrate and a seventh semiconductor layer of the second conductivity type that is higher in resistivity than the sixth semiconductor layer are epitaxially grown and are arranged in this order from the side of the semiconductor substrate, and that a low-resistivity eighth semiconductor anode layer of a first conductivity type is formed as a surface layer of the seventh semiconductor layer.

* * * * *